(12) United States Patent
Jin et al.

(10) Patent No.: US 6,368,732 B1
(45) Date of Patent: Apr. 9, 2002

(54) LIGHT-EMITTING POLYMERS HAVING HIGH EFFICIENCY AND COLOR TUNABLE PROPERTIES

(75) Inventors: Sung-Ho Jin; Ji-Hoon Lee, both of Taejeon (KR)

(73) Assignee: Samsung SDI Co., Ltd., Kyungki-do (KR)

( * ) Notice: Subject to any disclaimer, the term of this patent is extended or adjusted under 35 U.S.C. 154(b) by 0 days.

(21) Appl. No.: 09/644,242

(22) Filed: Aug. 23, 2000

(30) Foreign Application Priority Data

Aug. 23, 1999 (KR) ............................................ 99-35040

(51) Int. Cl.$^7$ .......................... H05B 33/00; C08G 77/04
(52) U.S. Cl. .................. 428/690; 428/917; 528/25; 528/42; 528/43; 257/40; 257/103
(58) Field of Search ................. 428/690, 917; 528/25, 42, 43; 257/40, 103

(56) References Cited

U.S. PATENT DOCUMENTS

| | | | | |
|---|---|---|---|---|
| 5,731,599 A | * | 3/1998 | Hwang et al. ................ | 257/40 |
| 5,909,038 A | * | 6/1999 | Hwang et al. ............... | 257/103 |
| 6,232,001 B1 | * | 5/2001 | Igarashi ....................... | 428/690 |

* cited by examiner

Primary Examiner—Cynthia H. Kelly
Assistant Examiner—Dawn L. Garrett
(74) Attorney, Agent, or Firm—The Law Offices of Eugene M. Lee, PLLC

(57) ABSTRACT

A light-emitting polymer is represented by the following formula (I):

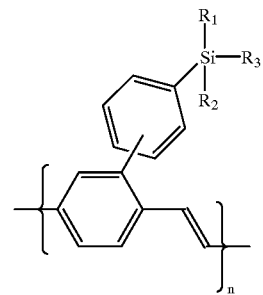

wherein $R_1$, $R_2$ and $R_3$ are selected from the group consisting of linear aliphatic alkyl groups, branched alkyl groups and fluorinated alkyl groups. Light-emitting copolymers formed by copolymerizing units of formula (I) with MEH-PPV (methoxyethylhexyloxy-PPV) are also provided.

16 Claims, 23 Drawing Sheets

LIGHT-EMITTING POLYMERS HAVING HIGH EFFICIENCY AND COLOR TUNABLE PROPERTIES

FIELD OF THE INVENTION

The present invention relates to light-emitting polymers. More specifically, the present invention relates to light-emitting polymers in which the light-emitting efficiency is improved, and the color tuning is superior, the structure being such that the main chain is composed of poly(p-phenylenevinylene), and the side chain is a phenyl silicon with aliphatic alkyl groups.

BACKGROUND OF THE INVENTION

Since semiconductor devices have been developed, the electronic technology has achieved an astounding progress in improving the cultural living of mankind. In particular, optical communications and multi-media have rapidly progressed in recent times to accelerate progress toward the present information society. Accordingly, optoelectronic devices which utilize the conversion of photons to electrons and vice versa has become the core of the modem electronic industries.

Optoelectronic devices are roughly classified as light emitting devices, light receiving devices, and combined devices. So far, most displays have been the light receiving type, whereas the electroluminescent display (ELD), a light emitting type, is fast in response speed, requires no backlights, and has superior brightness and other advantages. Therefore, the ELD is being briskly studied in recent times because of its applicability to future color display devices.

This electroluminescence phenomenon has been introduced to practical use by utilizing GaN, ZnS, SiC and the like in inorganic semiconductor devices. However, in the inorganic ELD, a driving voltage of AC 200 V or more is required, and the ELD is manufactured by applying a vacuum deposition process. Therefore, it cannot be applied to a large-scale device, and the manufacturing cost is also high.

Besides the inorganic ELD, organic and polymer ELDs had been developed. Pope et al reported the EL phenomenon of an organic material in 1963, and Tang et al. of the Eastman Kodak company disclosed in 1987 a light emitting device which is manufactured with π-conjugated alumina-quinone ($Alq_3$). In the device, the quantum efficiency is 1% at less than 10 V, and the brightness is 1000 $cd/m^2$. Since the disclosure of the device, many studies have been carried out. The synthesizing process is simple, and therefore diversified polymeric materials can be synthesized, and color tuning can also be achieved. However, the polymeric materials of the device are poor in processability and thermal stability, and when the voltage is applied to the device, rearrangement of the polymer molecules occurs due to the joule heat that is generated in the light emitting layer. The rearrangement of the molecules causes critical damage to the light emitting efficiency and life expectancy of the device. In order to compensate for this shortcoming, there has been developed a polymeric material having a particular structure for the organic ELD, the so-called "π-conjugated polymer". In the polymer, due to the overlapping of the π-electron wave functions of the main chain of the polymer, the energy level is divided into two bands, and the semiconductor properties of the polymer depend on the energy difference between the two energy bands. Through adjustments of the band gap between the two energy bands, a full color can be realized.

In 1990, researchers at Cambridge University in England first disclosed an ELD which utilizes poly(p-phenylenevinylene) (PPV) as a polymer having conjugated double bonds. Since then, ELDs using conjugated polymers have been widely studied. There has recently been developed an ELD using a particular polymer, which surpasses the inorganic semiconductor ELD in efficiency in the visible light region. Further, light emitting polymers having a red, green or blue color have been developed so that full coloring would be achievable. However, if full coloring is to be realized, other problems such as light emitting efficiency, driving voltage and the like, must be solved.

In case of a π-electron conjugated polymer derivative, i.e., poly(p-phenylenevinylene) (PPV), which is used as a polymeric material for the typical organic ELD, obstacles to mass production of the polymer include factors such as insufficiency of repeatability of the polymer synthesis and device, purification of the polymer, solubility in organic solvents, polymerization period, and manufacturing process. Further, in order to overcome the joule heat when driving the device, the Tg and molecular weight of the polymer should be very high.

In general, the PPV organic EL material of the prior art has the following disadvantages. First, the polysulfonium which is a precursor of PPV requires too long a polymerization time, is prepared in a low yield and is expensive to manufacture. Second, in order to prepare a perfect PPV derivative, the sulfonium has to be completely removed, but this is very difficult. Third, in the case where a thin film having a thickness of 600 Å is formed, pin holes are formed on the layer when the unreacted sulfonium is removed, thereby reducing the uniformity of the film. Fourth, it is very difficult to synthesize a soluble PPV because the synthesis conditions are very fastidious. Fifth, the PPV manufacturing process is harmful to the environment.

Accordingly, the present inventors have developed light emitting polymers in which the light emitting efficiency is improved, and the color tuning is superior, the structure being such that the main chain is composed of poly(p-phenylenevinylene), and the side chain is a phenyl silicon with aliphatic alkyl groups.

SUMMARY OF THE INVENTION

A feature of the present invention is the provision of a new light-emitting polymer with good light emitting efficiency, the structure of the polymer being such that the main chain is composed of poly(p-phenylenevinylene), and the side chain is a phenyl silicon with aliphatic alkyl groups.

Another feature of the present invention is the provision of a light-emitting polymer having an excellent solubility in organic solvents by introducing a phenylsilicon derivative as a side chain.

A further feature of the present invention is the provision of a light emitting polymer having an improved surface property when used in forming electrodes.

A further feature of the present invention is the provision of a light-emitting polymer having improved film formability.

A further feature of the present invention is the provision of a new light emitting polymer with good color tuning, which is prepared by a copolymerization process such that the main chain is composed of poly(p-phenylenevinylene), and the side chain is a phenyl silicon with aliphatic alkyl groups and an MEH-PPV (methoxyethylhexyloxy-PPV).

The above features and other advantages can be attained by the descriptions presented below.

In accordance with one aspect of the present invention, a light emitting polymer is provided that includes a main chain composed of poly(p-phenylenevinylene) (PPV) units and side chains composed of phenyl silicon groups having aliphatic alkyl groups. The polymer is represented by the following formula (I):

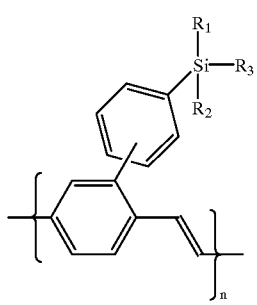

I wherein $R_1$, $R_2$ and $R_3$ are selected from the group consisting of linear aliphatic alkyl groups, branched alkyl groups and fluorinated alkyl groups.

In accordance with another aspect of the present invention, a light emitting copolymer is provided which is prepared by copolymerizing (a) a polymer including poly (p-phenylenevinylene) as the main chain and phenyl silicon groups with aliphatic alkyl groups as the side chain and (b) an MEH-PPV (methoxyethylhexyloxy-PPV). The light emitting copolymer is represented by the following formula (II):

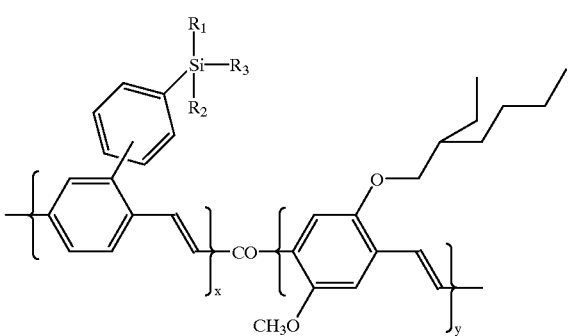

II where $R_1$, $R_2$ and $R_3$ are selected from the group consisting of a linear aliphatic alkyl group, a branched alkyl group and a fluorinated alkyl group, x is about 0.1–0.9 and y is about 0.9–0.1.

Electroluminescent devices including the inventive light emitting polymers and copolymers, and methods of producing the inventive copolymers, are also provided.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The above features and other advantages of the present invention will become more apparent by describing in detail the preferred embodiment of the present invention with reference to the attached drawings in which.

DETAILED DESCRIPTION OF THE PREFERRED EMBODIMENT

Figure 1:
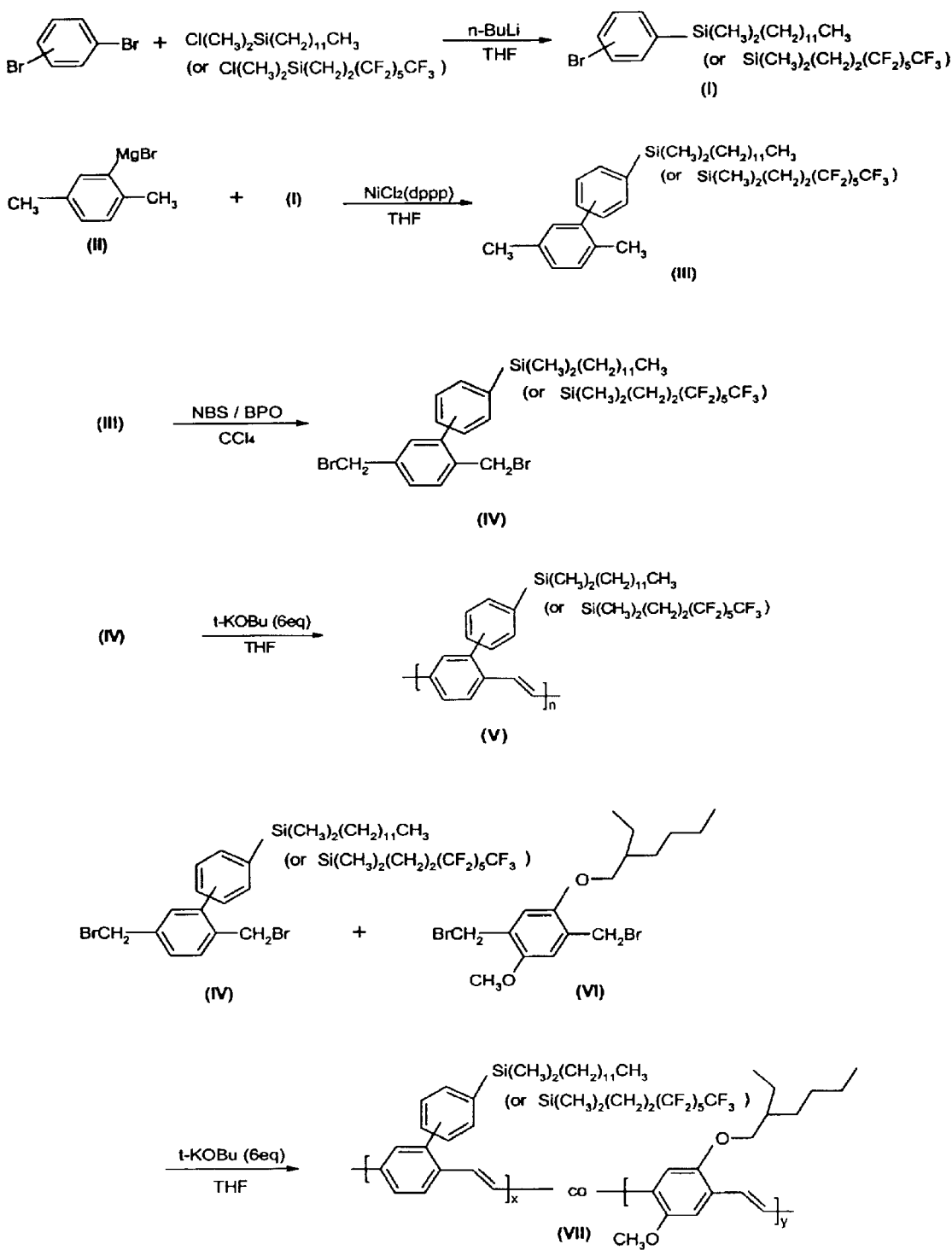
FIG. 1 illustrates two chemical processes for preparing a light emitting polymer and a light emitting copolymer according to the present invention.

The priority Korean Patent Application No. 1999-35040, filed Aug. 23, 1999, is incorporated herein in its entirety by reference.

In an organic light emitting polymer, the transfer of holes affects the driving voltage of an EL device, while the transfer of electrons affects the light emitting efficiency of the device. In a light emitting polymer, the introduction of holes is easy, while the introduction of electrons is difficult.

Generally, in an EL device prepared with a light-emitting polymer, holes are introduced from the anode to the light emitting polymer layer, and electrons are introduced from the cathode to the light emitting polymer layer. In the polymer, the holes and electrons form singlet exitons through recombination. The singlet exitons undergo radiative decay, thereby emitting lights corresponding to the band gap of the material. The light emitting efficiency is affected by this circumstance. That is, if the amount of the holes introduced is equal to the amount of the electrons introduced, the light emitting efficiency can be maximized. Further, the transfer of carriers depends on the transfers of the holes and electrons. To provide a good transfer of the carriers, the transfers of the holes and electrons should be balanced.

However, generally, the holes can transfer more easily than the electrons, with the result that an imbalance occurs in the transfer of carriers, thereby reducing the light emitting efficiency. Particularly, in the π-electron conjugated polymer, the migration of holes is far greater, and therefore, in order to compensate for this phenomenon, an electron transport layer is provided, thereby forming a multi-layer device.

To improve the light emitting efficiency of an organic EL polymer, a method has been used which lowers the energy barrier for the electrons to transfer by using a cathode with the least work function or a polymeric material with a high electron affinity. The method using a polymeric material with a high electron affinity is to lower the energy barrier for the electrons to transfer, in other words, to lower the potentials of the lowest unoccupied molecular orbital (LUMO) and the highest occupied molecular orbital (HOMO) of the polymer by linking a substituted group with a good electron affinity to the main chain of the conjugated polymer. So far, —$CF_3$ and —CN are known as the electron affinity substituted groups.

In the present invention, the light emitting polymer has a main chain composed of poly(p-phenylenevinylene) (PPV) and side chains composed of phenyl silicon groups with aliphatic alkyl groups. In other words, the phenyl silicon groups with aliphatic alkyl groups are bonded to the repeating units of poly(p-phenylenevinylene). One of the light emitting polymers according to the present invention is represented by the following formula (I):

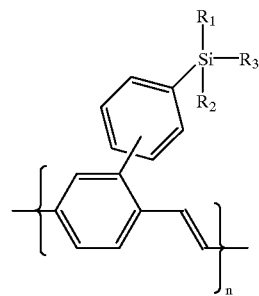

where $R_1$, $R_2$ and $R_3$ are selected from the group consisting of a linear aliphatic alkyl, a branched alkyl and a fluorinated alkyl. More particularly, the linear aliphatic alkyl is represented by $(CH_2)_n CH_3$ where n is an integer from 0 to 12, the branched alkyl is represented by $CH_2(CH_2)_a CH(CH_2)_b CH_3 CH(CH_3)_2$ where a is an integer from 0 to 5 and b is an integer from 0 to 10, and the fluorinated alkyl is represented by $CH_2(CF_2)_n CF_3$ where n is an integer of from 0 to 12.

The phenyl silicon group of the light-emitting polymer according to the present invention is a phenyl group in which a silicon alkyl group is bonded at the meta- or para-position. Non-limiting examples of the phenyl silicon group include poly {2-(3'-dimethylalkylsilylphenyl)-1,4-phenylenevinylene}(m-SiPhPPV) in which a silicon alkyl group is bonded to the meta-position of the phenyl group, and poly{2-(4'-dimethylalkylsilylphenyl)-1,4-phenylenevinylene}(p-SiPhPPV) in which a silicon alkyl group is bonded to the para-position of the phenyl group. The phenyl silicon groups as side chains increase the solubility of the light emitting polymer in conventional organic solvents, and improve the surface properties of electrodes, so that a superior polymer layer can be formed. The light-emitting polymer in which the phenyl silicon group is introduced requires a driving voltage of 5–7 V, and can form a green electroluminescent display having excellent electrochemical properties.

Another light emitting polymer according to the present invention is a copolymer which is prepared by copolymerizing the polymer composed of poly(p-phenylenevinylene) as the main chain and phenyl silicon groups with aliphatic alkyl groups as the side chains and an MEH-PPV (methoxyethylhexyloxy-PPV). The copolymer is prepared by copolymerizing the polymer of formula (1) above and an MEH-PPV (methoxyethylhexyloxy-PPV). The copolymer is prepared in the form of poly[{2-(3'-dimethyldodecylsilylphenyl)-co-(2-methoxy-5-ethylhexyloxy)}-1,4-phenylene vinylene](m-SiPhPPV-co-MEH-PPV), or poly[{2-(4'-dimethyldodecylsilylphenyl)-co-(2-methoxy-5-ethylhexyloxy)}-1,4-phenylene-vinylene](p-SiPhPPV-co-MEH-PPV). The copolymer is represented by the following formula (II):

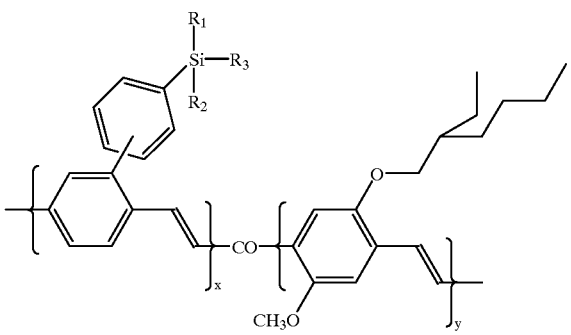

where $R_1$, $R_2$ and $R_3$ are selected from the group consisting of a linear aliphatic alkyl, a branched alkyl and a fluorinated alkyl, x is about 0.1–0.9; and y is about 0.9–0.1. More particularly, the linear aliphatic alkyl is represented by $(CH_2)_nCH_3$ where n is an integer from 0 to 12, the branched alkyl is represented by $CH_2(CH_2)_aCH(CH_2)_bCH_3CH(CH_3)_2$ where a is an integer from 0 to 5 and b is an integer from 0 to 10, and the fluorinated alkyl is represented by $CH_2(CF_2)_n CF_3$ where n is an integer from 0 to 12.

The light-emitting copolymer of formula (II) is prepared by copolymerizing the polymer of formula (I) above and an MEH-PPV (methoxyethylhexyloxy-PPV). In the copolymer, color tuning from green to reddish orange can be achieved by controlling the amount of MEH-PPV copolymerized with the polymer of formula (I). When manufacturing an EL display using the copolymer of the present invention, the display has a driving voltage of about 3.9 V, a maximum light emitting efficiency of about 2.2 lm/w, and a maximum brightness of about 11,000 cd/m².

For preparing the light emitting polymers and copolymers according to the present invention, the Gilch polymerization process is adopted rather than the Wittig process. While the light emitting polymers prepared by the Wittig process has a number average molecular weight of about 10,000, the light emitting polymers and copolymers prepared by the Gilch process have a number average molecular weight of from about 10,000 to about 1,000,000 and a molecular weight distribution of about from 1.5 to about 5.0.

FIG. 1 illustrates two chemical processes for preparing a light emitting polymer and a light emitting copolymer according to the present invention.

As shown in the first process of FIG. 1, one of the light emitting polymers represented by formula (I) is prepared as follows:

Anhydrous THF and 1,4-dibromobenzene are put into a Schlenk flask which has been filled with nitrogen. n-BuLi (1.6 M n-hexane solution) is slowly dropped into the solution via syringe. Dimethyldodecylsilyl chloride is slowly dropped into the reaction mixture to prepare 1-bromo-4-(dimethyldodecylsilyl)benzene (I). 1,4-Dimethyl-2-(4'-dimethyldodecylsilylphenyl)benzene (III) is prepared by reacting compound (II) and compound (I). 1,4-Bis(bromomethyl)-2-(4'-dimethyldodecylsilylphenyl)benzene (IV) is prepared from compound (III).

Poly{2-(4'-dimethyldodecylsilylphenyl)-1,4-phenylenevinylene})(p-SiPhPPV) (V) is prepared by polymerizing compound (IV).

As shown in the second process of FIG. 1, one of the light emitting copolymers represented by formula (II) is prepared as follows:

Poly[{2-(3'-dimethyldodecylsilylphenyl)-co-(2-methoxy-5-ethylhexyloxy)}-1,4-phenylene vinylene](m-SiPhPPV-co-MEH-PPV) (VII) is prepared by copolymerizing 1,4-bis(bromomethyl)-2-(4'-dimethyldodecylsilylphenyl)benzene (IV) and 1,4-bis(chloromethyl)-2-((2-ethylhexyl)oxy) 5-methoxybenzene (VI).

For manufacturing an electroluminescent (EL) diode (light emitting diode), the light emitting polymer or copolymer is used for the light emitting layer. The EL devices can have a structure of anode/light emitting layer/cathode, anode/buffer layer/light emitting layer/cathode, anode/buffer layer/hole transporting layer/light emitting layer/cathode, anode/buffer layer/hole transporting layer/light emitting layer/electron transporting layer/cathode, or anode/buffer layer/hole transporting layer/light emitting layer/hole blocking layer/cathode. The buffer layers are preferably made of polythiophene, polyaniline, polyacetylene, polypyrrole, or poly(p-phenylenevinylene) derivatives. The hole blocking layers are preferably made of LiF or $MgF_2$.

Figure 5:
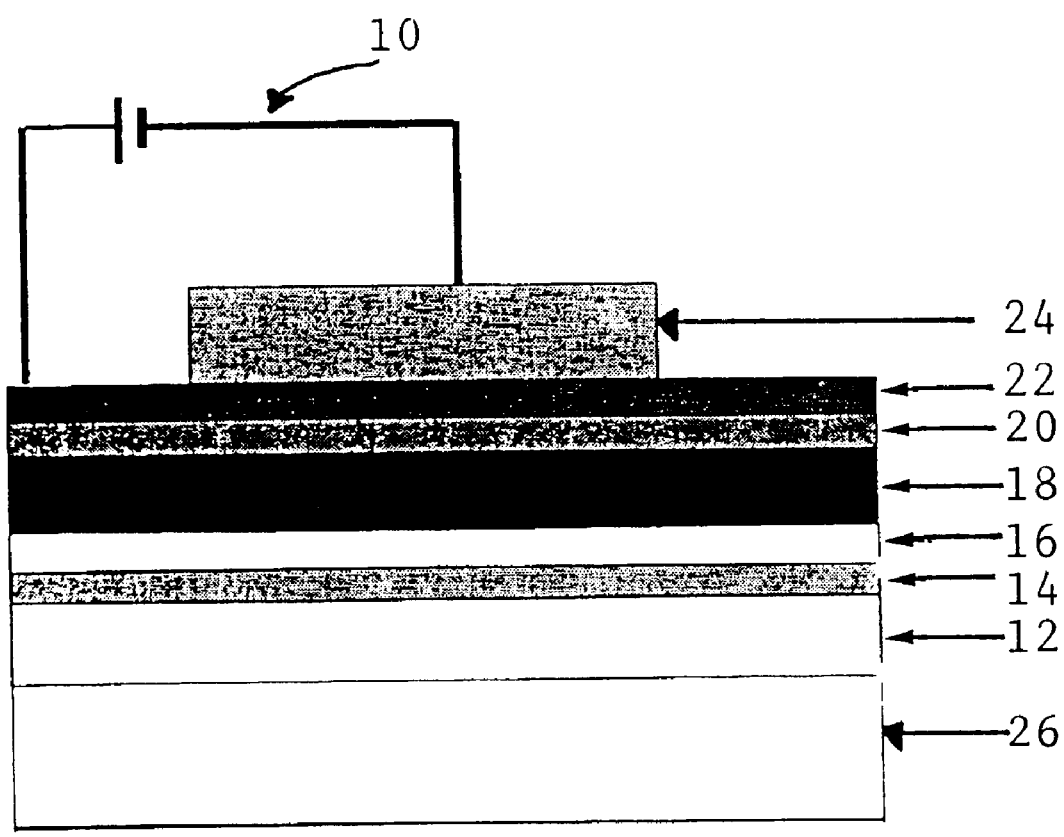
FIG. 5 is a cross-sectional view of an EL device manufactured with a light emitting polymer according to the present invention.

FIG. 5 is a cross-sectional view of an EL device 10 manufactured with a light emitting polymer according to the present invention. The EL device 10 has a structure of anode 12/buffer layer 14/hole transporting layer 16/light emitting layer 18/electron carrying layer 20/hole blocking layer 22/cathode 24. The whole structure is formed on a glass substrate 26. The cathode 24 can be made, for example, of aluminum or calcium or an alloy of aluminum and lithium As described above, the present invention provides a light emitting polymer or copolymer which has a lower driving voltage, an improved light emitting efficiency, an improved brightness, and an excellent color tuning from green to reddish orange.

The present invention will be further described with the following non-limiting examples.

EXAMPLES

EXAMPLE 1

Preparation of electroluminescent (EL) polymer (polymer 1)

(1) Preparation of 1-bromo-4-(dimethyldodecylsilyl)benzene (I)

100 mL of THF and 8.5 g (0.036 moles) of 1,4-dibromobenzene were put into a Schlenk flask which had been filled with nitrogen. Then the flask was agitated. The temperature was maintained at −78° C. by using acetone/dry ice. 22.6 mL (0.036 moles) of n-BuLi (1.6 M n-hexane solution) was slowly dropped into the reaction mixture over 10 minutes. After several minutes, a white salt began to be formed. After completion of the dropping of n-BuLi, a further agitation was carried out for about one hour. Then 10 g of dimethyldodecylsilyl chloride dissolved in 20 mL of THF was slowly dropped into the solution. Then the solution became clearer. After about three hours, the solution was put into 300 nL of water, and extracted with ethyl acetate. The extracts were dried by using anhydrous $MgSO_4$ and filtered with a solvent, and then the solvent was evaporated. The obtained oil was either distilled in a vacuum (boiling point of 160–170° C./1.5 mmHg), or purified by a silica gel chromatography (eluent: n-hexane). Thus, 1-bromo-4-(dimethyldodecylsilyl)benzene (I) was obtained with a yield of about 90 % or above. The chemical structure of compound (I) was identified through 1H-NMR as follow: 1H-NMR ($CDCl_3$): δ0.24 (s, 6H, $Si(CH_3)_2$), 0.72 (t, 2H, $SiCH_2$), 0.89 (t, 3H,—$CH_3$), 1.27 (m, 20H, $(CH_2)_{10}$, 7.37 and 7.49 (d, 4H, aromatic protons).

(2) Preparation of p-xylene-2-magnesium Bromide (II)
p-Xylene-2-magnesium bromide was manufactured by the conventional Grignard reaction. THF was used as a solvent, and p-xylene-2-magnesium bromide was refluxed for about 2–3 hours and used.

(3) Preparation of 1,4-dimethyl-2-(4'-dimethyldodecylsilylphenyl)benzene (III)

0.11 g (0.5 mole%) of $NiCl_2$ (dppp) and 12.45 g (0.0325 moles) of 1-bromo-4-(dimethyldodecylsilyl)benzene prepared in Step (1) above were added to 60–70 mL of THF. Then this mixture was transferred to a Schlenk flask of 250 mL and mixed with the Grignard reagent prepared in Step (2) above. The mixture was refluxed over one night, then put into 300 mL of water and extracted with ethyl acetate. The extracts were dried by using anhydrous $MgSO_4$ and filtered with a solvent, and then the solvent was evaporated. The obtained oil was purified by a silica gel chromatography (eluent: n-hexane). Thus, 1,4-dimethyl-2-(4'-dimethyldodecylsilylphenyl)benzene (III) was obtained with a yield of about 80% or above. The chemical structure of compound (III) was identified through 1H-NMR as follow: 1H-NMR ($CDCl_3$): δ 0.27 (s, 6H, $Si(CH_3)_2$, 0.77 (t, 2H, $SiCH_2$), 0.88 (t, 3H—$CH_3$), 1.26 (m, 20H, $(CH_2)_{10}$), 2.24 and 2.34 (s, 6H, $2CH_3$ on benzene ring), 7.05–7.55 (m, 7H, aromatic protons).

(4) Preparation of 1,4-bis(bromomethyl)-2-(4'-dimethyldodecylsilylphenyl)benzene (IV) 10.0 g (0.0245 moles) of 1,4-dimethyl-2-(4'-dimethyldodecylsilylphenyl)benzene (III), 8.87 g (98% content) (0.049 moles) of N-bromosuccinimide, and benzoyl peroxide (BPO) as catalyst were put into 200 mL of anhydrous $CCl_4$ contained in a Schlenk flask of 250 mL, and then the solution was heated for about 12 hours. The heated solution was filtered to remove the white solid succinimide. The filtered $CCl_4$ solution was condensed with a distillation drier and purified by a silica gel chromatography (eluent: n-hexane). The yield of compound (IV) was 40–50%, and the chemical structure was identified through 1H-NMR as follow: 1H-NMR ($CDCl_3$): δ 0.29 (s, 6H, $Si(CH_3)_2$, 0.79 (t, 2H, $SiCH_2$), 0.88 (t, 3H—$CH_3$), 1.26 (m, 20H, $(CH_2)_{10}$, 4.45 and 4.50 (s, 4H, 2—$CH_2Br$), 7.29–7.62 (d, 7H, aromatic protons).

(5) Preparation of Poly{2-(4'-dimethyldodecylsilylphenyl)-1,4-phenylenevinylene}) (p-SiPhPPV) (V)

The monomer 1,4-bis(bromomethyl)-2-(4'-dimethyldodecylsilylphenyl) benzene (IV) was dissolved in THF, the concentration of monomer being 1 wt %, and the solution was agitated at a temperature of 0° C. During the agitation, potassium tert-butoxide (1.0 M THF solution, three equivalents to the monomer) was slowly dropped by using a syringe. When the amount of the potassium tert-butoxide exceeded 1.5–2.0 equivalents, the solution gradually came to be sticky. After agitating it for about three hours, this mixture was immersed into a large amount of methyl alcohol or isopropyl alcohol. The obtained polymer was purified by using the Soxhlet device, re-precipitated, and dried, thereby obtaining a final polymer (V). The yield was about 80%. The number average molecular weight of the obtained polymer was about 300,000 to 600,000. The chemical structure was identified through 1H-NMR as follow: 1H-NMR ($CDCl_3$): δ 0.30 (s, 6H, $Si(CH_3)_2$, 0.70–0.98 (m, 5H, $SiCH_2$ and —$CH_3$), 1.10–1.52 (m, 20H, $(CH_2)_{10}$), 7.10–7.80 (br, 9H, aromatic proto and vinyl protons).

Figure 2:
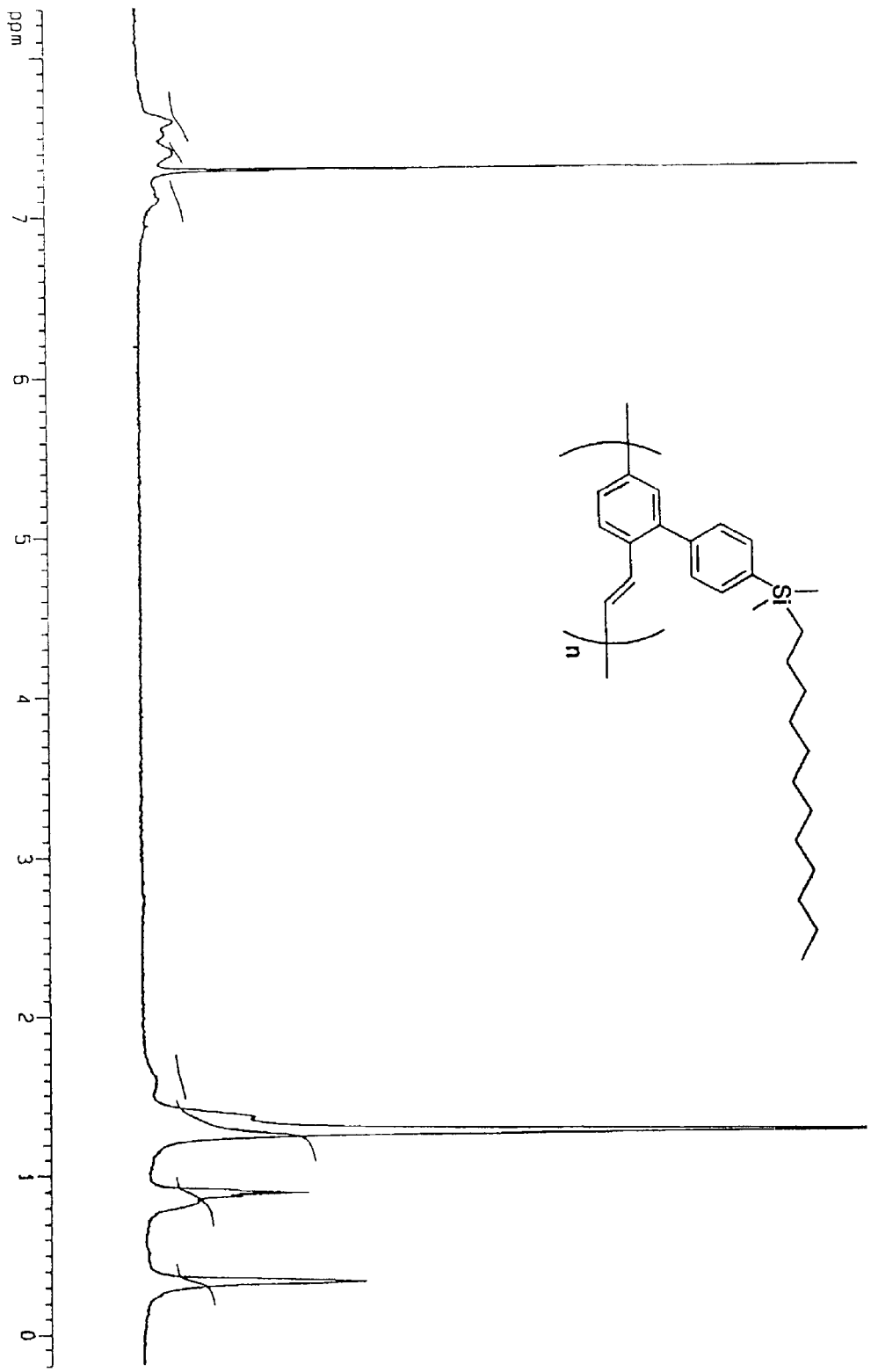
FIG. 2 is a 1H-NMR spectrum for poly {2-(4'-dimethyldodecylsilylphenyl)-1,4-phenylenevinylene}(p-SiPhPPV) as an embodiment of the present invention.

FIG. 2 is a 1H-NMR spectrum for poly {2-(4'-dimethyldodecylsilylphenyl)-1,4-phenylenevinylene}(p-SiPhPPV).

Example 2

Preparation of Electroluminescent Polymer (polymer 2)

(1) Preparation of 1-bromo-3-(dimethyldodecylsilyl) benzene (I) 100 mL of THF and 0.019 mol (4.62 g) of anhydrous 1,3-dibromobenzene were put into a Schlenk flask which had been filled with nitrogen. The solution was agitated, and during the agitation, the temperature was maintained at −78° C. by using acetone/dry ice. n-BuLi in an amount of 0.019 mol (11.875 mL) was slowly dropped over 10 minutes into a 1.6 M n-hexane solution. After several minutes, a white salt began to be formed. After completion of the dropping of n-BuLi, the solution was agitated for about 1 hour. Then 0.019 mol (5 g) of dimethyldodecyl-silyl chloride was slowly dropped into the solution. The temperature of −78° C. was maintained for about one hour, and the temperature was slowly raised to room temperature. Then the solution became clearer. After about three hours, the solution was put into 300 mL of water, and extracted with ethyl acetate. Then the extracts were dried by using anhydrous $MgSO_4$ and filtered with a solvent, and then the solvent was evaporated. The obtained oil was either distilled in a vacuum (boiling point of 160° C./1 mmHg), or purified by a silica gel chromatography (eluent: n-hexane). Thus, 1-bromo-4-(dimethyldodecylsilyl)benzene (I) was obtained with a yield of about 70%. The chemical structure of compound (I) was identified through 1H-NMR as follow: 1H-NMR ($CDCl_3$): δ 0.28 (s, 6H, $Si(CH_3)_2$), 0.9 (t, 2H, $SiCH_2$), 1.2 (t, 3H, —$CH_3$), 1.5 (m, 20H, $(CH_2)_{10}$), 7.2–7.62 (d, 4H, aromatic protons).

(2) Preparation of p-xylene-2-magnesium Bromide (II)

p-Xylene-2-magnesium bromide was prepared in the same manner as in Step (2) of Example 1.

(3) Preparation of 1,4-dimethyl-2-(3'-dimethyldodecylsilylphenyl)benzene (III)

0.006 g (0.001 mole %) of $NiCl_2$ (dppp) and 12.45 g (0.0325 moles) of 1-bromo-3-(dimethyldodecylsilyl) benzene prepared in Step (1) above were added to 60–70 mL of THF. Then this mixture was transferred to a Schlenk flask of 250 mL and mixed with the Grignard reagent prepared in Step (2) above. The mixture was refluxed over one night then put into 300 mL of water, and extracted with ethyl acetate. The extracts were dried by using anhydrous $MgSO_4$ and filtered with a solvent, and then the solvent was evaporated. The obtained oil was purified by a silica gel chromatography (eluent: n-hexane). Thus, 1,4-dimethyl-2-(3'-dimethyldodecylsilylphenyl)benzene (III) was obtained with a yield of about 70%. The chemical structure of compound (III) was identified through 1H-NMR as follow: 1H-NMR ($CDCl_3$): δ 0.3 (s, 6H, $Si(CH_3)_2$), 0.77 (t, 2H, $SiCH_2$), 0.82 (t, 3H, —$CH_3$), 1.26 (m, 20H, $(CH_2)_{10}$), 2.4 and 2.6 (s, 6H, $2CH_3$ on benzene ring), 6.9–7.7 (m, 7H, aromatic protons).

(4) Preparation of 1,4-bis(bromomethyl)-2-(3'-dimethyldodecylsilylphenyl)benzene (IV)

7 g (0.0192 mol) of 1,4-dimethyl-2-(3'-dimethyldodecylsilylphenyl) benzene (III), 7.9 g (98% content) (0.0442 moles) of N-bromosuccinimide, and benzoyl peroxide (BPO) as catalyst were put into 200 mL of anhydrous $CCl_4$ which was contained in a Schlenk flask of 250 mL, and then the solution was heated for about 3 hours. The heated solution was filtered to remove the white solid succinimide. The filtered $CCl_4$ solution was condensed with a distillation drier and purified by a silica gel chromatography (eluent: n-hexane). The yield of compound (IV) was about 25%, and the chemical structure was identified through 1H-NMR as follow: 1H-NMR ($CDCl_3$): δ 0.29 (s, 6H, $Si(CH_3)_2$), 0.79 (t, 2H, $SiCH_2$), 0.88 (t, 3H, —$CH_3$), 1.5 (m, 20H, $(CH_2)_{10}$), 4.2 and 4.5 (s, 4H, 2-$CH_2Br$), 7.2–7.62 (d, 7H, aromatic protons).

(5) Preparation of poly{2-(3'-dimethyldodecylsilylphenyl)-1,4-phenylenevinylene}(m-SiPhPPV) (V)

The monomer 1,4-bis(bromomethyl)-2-(3'-dimethyldodecylsilylphenyl) benzene (IV) was dissolved in THF, the concentration of monomer being 1 wt %, and the solution was agitated at a temperature of 0° C. During the agitation, potassium tert-butoxide(1.0 M THF solution, about six equivalents to the monomer) was slowly dropped by using a syringe. When the amount of the potassium tert-butoxide exceeded 1.5–2.0 equivalents, the solution gradually came to be sticky. After agitating it for about two hours, this mixture was immersed into a large amount of methyl alcohol or isopropyl alcohol. The obtained polymer was purified by using the Soxhlet device, re-precipitated, and dried, thereby obtaining a final polymer (V). The yield was about 80%. The number average molecular weight of the obtained polymer was about 300,000 and the dispersity was about 2. The chemical structure was identified through 1H-NMR as follow: 1H-NMR (CDCl$_3$): δ 0.30 (s, 6H, Si(CH$_3$)$_2$, 0.70–0.98 (m, 5H, SiCH$_2$ and —CH$_3$), 1.10–1.52 (m, 20H, (CH$_2$)$_{10}$), 7.10–7.80 (br, 9H, aromatic protons and vinyl protons).

Figure 3:
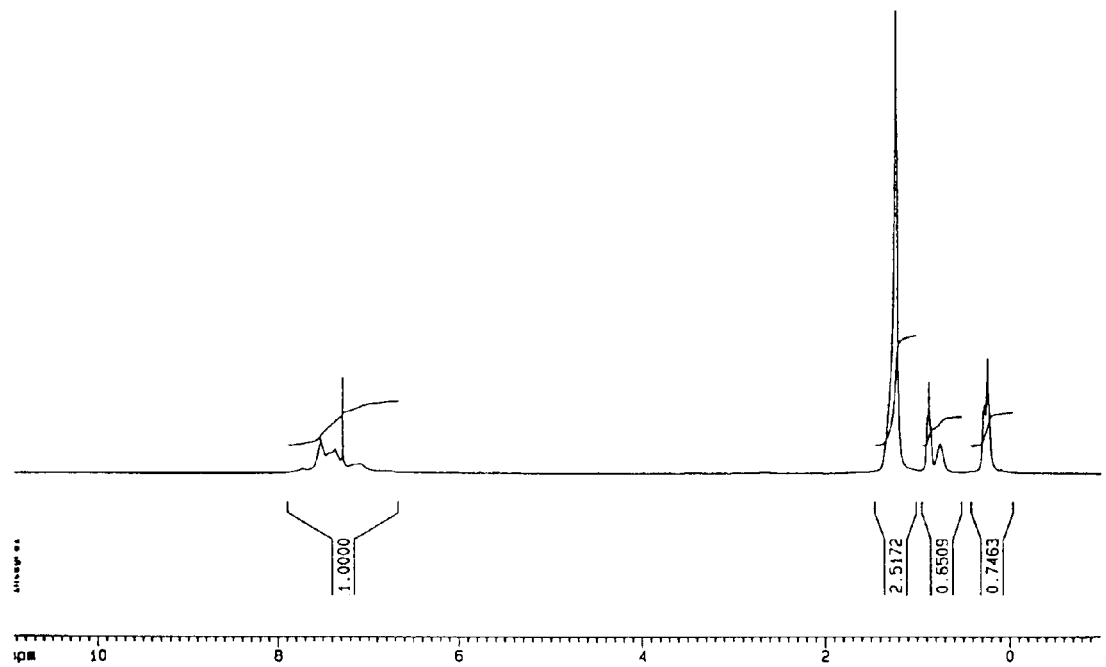
FIG. 3 is a 1H-NMR spectrum for poly {2-(3'-dimethyldodecylsilylphenyl)-1,4-phenylenevinylene}(m-SiPhPPV) as another embodiment of the present invention.

FIG. 3 is a 1H-NMR spectrum for poly {2-(3'-dimethyldodecylsilylphenyl)-1,4-phenylenevinylene}(p-SiPhPPV).

Example 3.

Preparation of Electroluminescent Polymer (polymer 3)

(1) Preparation of 1-bromo-4-(1H,1H,2H,2H-perfluorooctyldimethylsilyl)benzene (I)

100 mL of anhydrous THF and 0.055 moles (12.98 g) of 1,4-dibromobenzene were put into a Schlenk flask which had been filled with nitrogen. The solution was agitated, and during the agitation, the temperature was maintained at −78° C. by using acetone/dry ice. n-BuLi in an amount of 0.055 moles (27.5 mL, 2.0 M n-pentane solution) was slowly dropped into the reaction mixture over 15 minutes. After several minutes, a white salt began to be formed. After completion of the dropping of n-BuLi, the solution was agitated out for about 1 hour at −10° C. Then 0.055 moles (24.25 g) of 1H,1H,2H,2H-perfluorooctyldimethylchlorosilane was slowly dropped into the solution. Then the solution became clearer. After about three hours, the solution was put into 300 mL of water, and extracted with chloroform. Then the extracts were dried by using anhydrous MgSO$_4$ and filtered with a solvent, and then the solvent was evaporated. The obtained oil was purified by a silica gel chromatography (eluent: n-hexane). Thus, 1-bromo-4-(perfluorooctyldimethylsilyl)benzene (I) was obtained with a yield of about 70%. The chemical structure of compound (I) was identified through 1H-NMR as follow: 1H-NMR (CDCl$_3$): δ 0.34 (s, 6H, Si(CH$_3$)$_2$), 1.01 (m, 2H, SiCH$_2$), 2.00 (m, 3H, —CH$_3$CF$_2$), 7.38 and 7.54 (d, 4H, aromatic protons).

(2) Preparation of p-xylene-2-magnesium Bromide (II)

p-Xylene-2-magnesium bromide was prepared in the same manner as in Step (2) of Example 1.

(3) Preparation of 1,4-dimethyl-2-(4'-1H,1H,2H,2H-perfluorooctyldimethylsilylphenyl)benzene (III)

0.11 g (0.5 mole %) of NiCl$_2$ (dppp) and 16.16 g (0.0288 mole) of 1-bromo-4-(1H,1H,2H,2H-perfluorooctyldimethylsilyl)benzene prepared in Step (1) above were added to 60–70 mL of anhydrous THF. Then this mixture was transferred to a Schlenk flask of 250 nL and mixed with the Grignard reagent prepared in Step (2) above. The mixture was refluxed over one night, then put into 300 mL of water, and extracted with ethyl acetate. The extracts were dried by using anhydrous MgSO$_4$ and filtered with a solvent, and then the solvent was evaporated. The obtained oil was purified by a silica gel chromatography (eluent: n-hexane). Thus, 1,4-dimethyl-2-(4'-1H,1H,2H,2H-perfluorooctyldimethylsilylphenyl)benzene (III) was obtained with a yield of about 63%. The chemical structure of compound (III) was identified through 1H-NMR as follow: 1H-NMR (CDCl$_3$): δ 0.51 (s, 6H, Si(CH$_3$)), 1.17 (m, 2H, SiCH$_2$—), 2.17 (m, 3H, —CHCF$_2$—), 2.37 and 2.27 (s, 6H, 2CH$_3$ of xylene moiety),7.20–7.31 (m, aromatic protons of xylene moiety), 7.49 and 7.66 (d, 4H, aromatic protons).

(4) Preparation of 1,4-bis(bromomethyl)-2-(4'-1H,1H,2H,2H-perfluorooctyldimethylsilylphenyl)benzene (IV)

10.5 g (0.0181 mol) of 1,4-dimethyl-2-(4'-1H,1H,2H,2H-perfluorooctyldimethylsilylphenyl)benzene (III), 6.43 g (98% content) (0.0362 mol) of N-bromosuccinimide, and benzoyl peroxide (BPO) as catalyst were put into 200 mL of anhydrous CCl$_4$ which was contained in a Schlenk flask of 250 mL, and then the solution was heated for about 12 hours. The heated solution was filtered to remove the white solid succinimide. The filtered CCl$_4$ solution was condensed with a distillation drier and purified by a silica gel chromatography (eluent: n-hexane). The yield of compound (IV) was about 35–40 %, and the chemical structure was identified through 1H-NMR as follow: 1H-NMR (CDCl$_3$): δ 0.38 (s, 6H, Si(CH$_3$)$_2$), 1.04 (m, 2H, SiCH$_2$—), 2.06 (m, 3H, —CH$_2$CF$_2$—), 4.44 and 4.50 (s, 4H, 2—CH$_2$Br), 7.26–7.60 (m, 7H, aromatic protons).

(5) Preparation of Poly {2-(4'- 1 H,1 H,2H,2H-perfluorooctyldimethylsilylphenyl)-1,4-phenylenevinylene} (p-SiRfPhPPV) (V)

The monomer 1,4-bis(bromomethyl)-2-(4'-1H,1H,2H, 2H-perfluorooctyldimethylsilylphenyl)benzene (IV) was dissolved in THF, the concentration of monomer being 1 wt %, and the solution was agitated at a temperature of 0° C. During the agitation, potassium tert-butoxide(1.0 M THF solution, about three equivalents to the monomer) was slowly dropped by using a syringe. When the amount of the potassium tert-butoxide exceeded 1.5–2.0 equivalents, the solution gradually came to be sticky. After agitating it for about three hours, this mixture was immersed into a large amount of methyl alcohol. The obtained polymer was purified by using the Soxhlet device, re-precipitated, and dried, thereby obtaining a final polymer (V). The yield was about 70%. The number average molecular weight of the obtained polymer was about 110,000. The chemical structure was identified through 1H-NMR as follow: 1H-NMR (CDCl$_3$): δ 0.38 (br, 6H, Si(CH$_3$)$_2$), 0.92 (br, 2H, SiCH$_2$—), 2.04 (br, 3H, —CHcCF$_2$—), 7.08–7.70 (m,9H, aromatic protons and vinyl protons).

Example 4

Preparation of EL Copolymer (polymer 4)

(1) One-pot Preparation

1 ,4-Bis(1bromomethyl)-2-(3'-dimethyldodecylsilylphenyl)benzene prepared in Step (4) of Example 2, and 1,4-bis(chloromethyl)-2-((2-ethylhexyl) oxy)5-methoxybenzene (VI) were dissolved in THF by varying the mole ratios, the concentration of monomers being 1 wt %, and the solution was agitated at a temperature of 0° C. During this agitation, potassium tert-butoxide (1.0 M THF solution, six equivalents to the monomer) was slowly dropped by using a syringe pump over one hour. When the amount of the potassium tert-butoxide exceeded 1.5–2.0 equivalents, the solution became sticky. After agitating it for about two hours at 0° C., the mixture was immersed into a large amount of MeOH or isopropyl alcohol. Then the oligomers and catalyst were removed by using the Soxhlet device, and the mixture was reprecipitated and dried, thereby obtaining a final copolymer, poly[{2-(3'-dimethyldodecylsilylphenyl)-co-(2-methoxy-5-ethylhexyloxy)-1,4-phenylene-vinylene](m-SiPhPPV-co-MEH-PPV). The yield was about 70%. The light emitting copolymer, having a number average molecular weight of less than 80,000 was removed by using Dialysis Membranes obtained from the Spectrum Company. The number average molecular weight of the obtained copolymer was about $3.0 \times 10^6$ to $6.6 \times 10^6$, and the dispersity was about 2.3. The mole ratios of the resulting copolymers were determined by 1H-NMR analysis, where the integration of both —$OCH_3$ and $OCH_2$ (5H, ~4.0 ppm) in the unit of MEH-PPV and one of Si-$(CH_3)_2$ (6H, ~0.3 ppm) in the unit of m- or p-SiPhPPV were compared.

Figure 4:
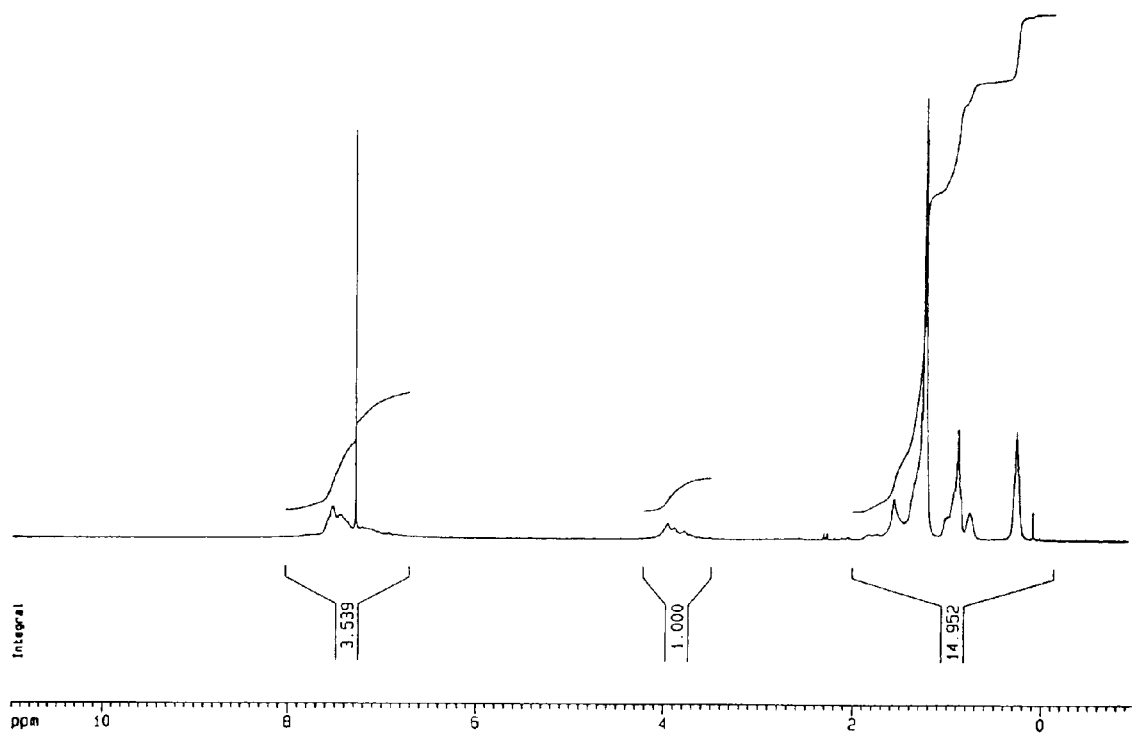
FIG. 4 is a 1H-NMR spectrum for poly[{2-(3'-dimethyldodecylsilylphenyl)-co-(2-methoxy-5-ethylhexyloxy)}-1,4-phenylenevinylene](m-SiPhPPV-co-MEHPPV) as still another embodiment of the present invention [monomer feed ratio=3:1; actual mole ratio=9 (m-SiPhPPV unit): 1 (MEHPPV unit)]

FIG. 4 is a 1H-NMR spectrum for poly [{2-(3'-dimethyldodecylsilylphenyl)-co-(2-methoxy-5-ethylhexyloxy)-1,4-phenylenevinylene](m-SiPhPPV-co-MEH-PPV) [monomer feed ratio=3:1; actual mole ratio=9 (m-SiPhPPV unit): 1 (MEH-PPV unit)]

(2) Multi-step Preparation

As there are great differences between the reactivities of the monomer 1,4-bis(bromo-methyl)-2-(3'-dimethyldodecylsilylphenyl)benzene prepared in Step (4) of Example 2 and of the comonomer 1,4-bis(chloromethyl)-2-((2-ethylhexyl)oxy)5-methoxybenzene, the comonomer was first polymerized, and then, the monomer was added, thereby carrying out a copolymerization. First, while the monomer component ratios were being controlled, the monomers were dissolved in THF anhydride, the monomer concentration being 1 wt %, and the mixture was agitated. At the same time, about two equivalents of potassium tert-butoxide (1.0 M THF solution, about 6 equivalents to the monomer) were slowly dropped over 20 minutes by using a syringe pump. After some progress of the copolymerization, the second monomer was added, and the rest of the potassium tert-butoxide was added. Then the copolymerization products became sticky. Further, the solution was agitated for 2 hours at a temperature of 0° C., and reprecipitated in a large amount of MeOH or isopropyl alcohol. Then the low molecular oligomers and the catalyst were removed from the light emitting copolymer by using the Soxhlet device. The copolymer was re-precipitated in MeOH, and was dried, thereby obtaining a final light emitting copolymer m-SiPhPPV-co-MEH-PPV, the yield being about 70%. The copolymers, having a number average molecular weight of less than 80,000, were removed by using Dialysis Membranes obtained from the Spectrum Company. The number average molecular weight of the obtained copolymer was about $2.0 \times 10^6$ to $8.0 \times 10^6$, and the dispersity was about 2.3. The chemical structure was identified through 1H-NMR as follow: 1H-NMR ($CDCl_3$): 0.30 (s, 6H, Si($CH_3)_2$, 0.70–0.98 (m, 5H, $SiCH_2$ and —$CH_3$), 1.10–1.52 (m, 20H, $(CH_2)_{10}$), 7.10–7.80 (br, 9H, aromatic proto and vinyl protons).

Manufacture of EL Devices

EL devices were manufactured by using the light emitting polymers, p-SiPhPPV of Example 1 and m-SiPhPPV of Example 2, and the light emitting copolymer, m-SiPhPPV-co-MEH-PPV of Example 4, respectively. The structure of the EL devices is as illustrated in FIG. 5. The manufacturing process for the EL devices was as follows. ITO (indium-tin oxide) was coated on a glass substrate, and the transparent glass substrate was thoroughly cleaned. Then the ITO was patterned by using a photoresist resin and an etchant, and then was thoroughly cleaned. Upon it, a conductive buffer layer was formed by coating Batron P 4083 obtained from the Bayer Company in a thickness of 500 Å, and then it was baked at a temperature of 180° C. for about 1 hour. On this structure, an organic EL polymer solution which was prepared by using chlorobenzene was spin-coated, and a baking was carried out. The solvent was completely removed within a vacuum oven, thereby forming a polymer thin film. The spin-coating of the polymer solution was carried out by filtering it by a 0.2 μm filter, and the thickness of the polymer thin film could be controlled by adjusting the spin speed and the concentration of the polymer solution. The thickness of the light emitting polymer was 50–200 nm. An insulating layer and a metal electrode were formed by carrying out depositions within a vacuum of $4 \times 10^{-6}$ torr by using a vacuum deposition machine (a thermal evaporating drier). During the deposition, the layer thickness and the layer growth speed were controlled by using a crystal sensor. The light emitting area was 4 $mm^2$, and the driving voltage was a dc forward bias voltage.

Measurement of Optical Properties

Figure 6:
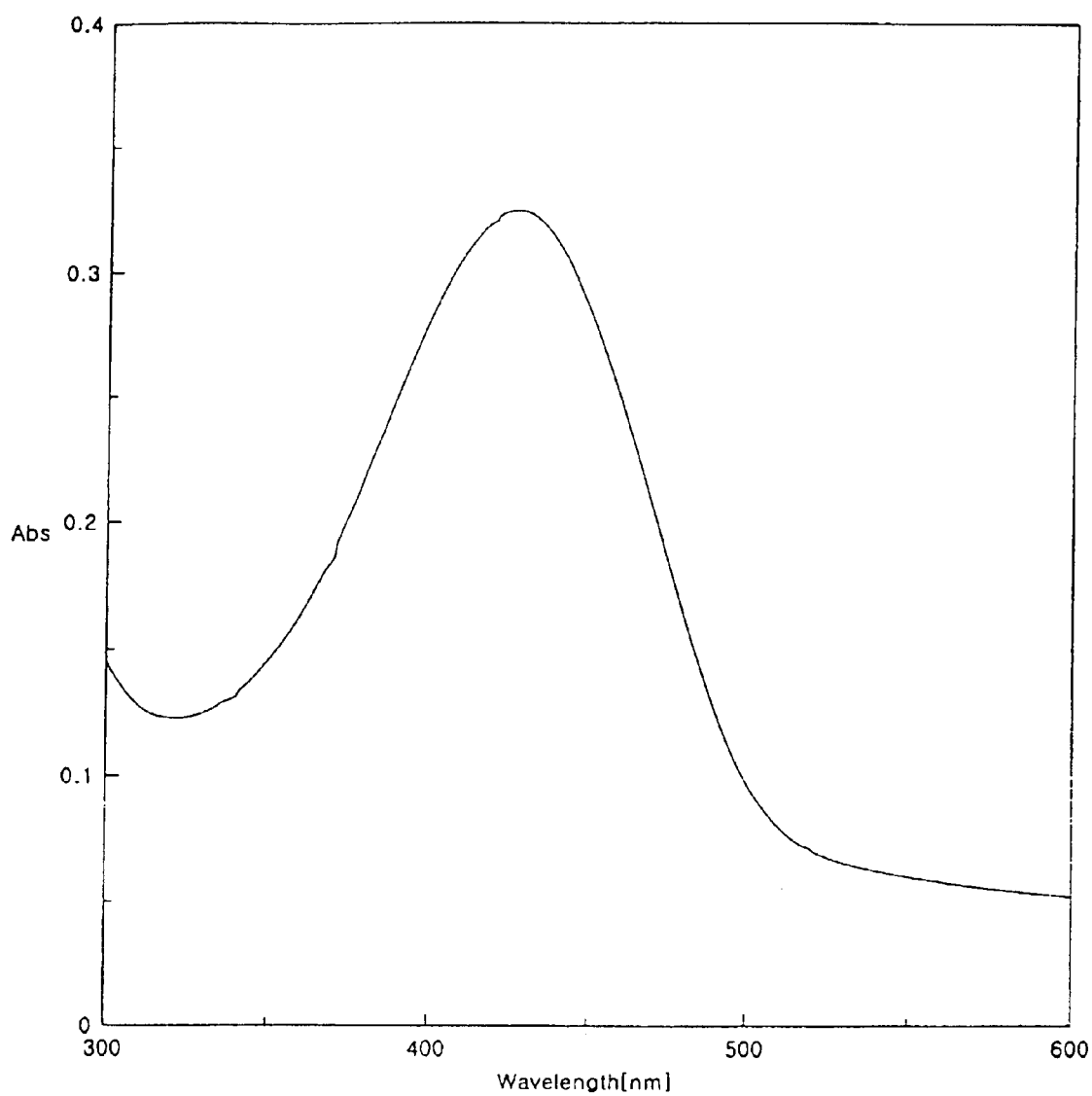
FIG. 6 is a UV-VIS spectrum of p-SiPhPPV as a light emitting polymer according to the present invention.
Figure 7:
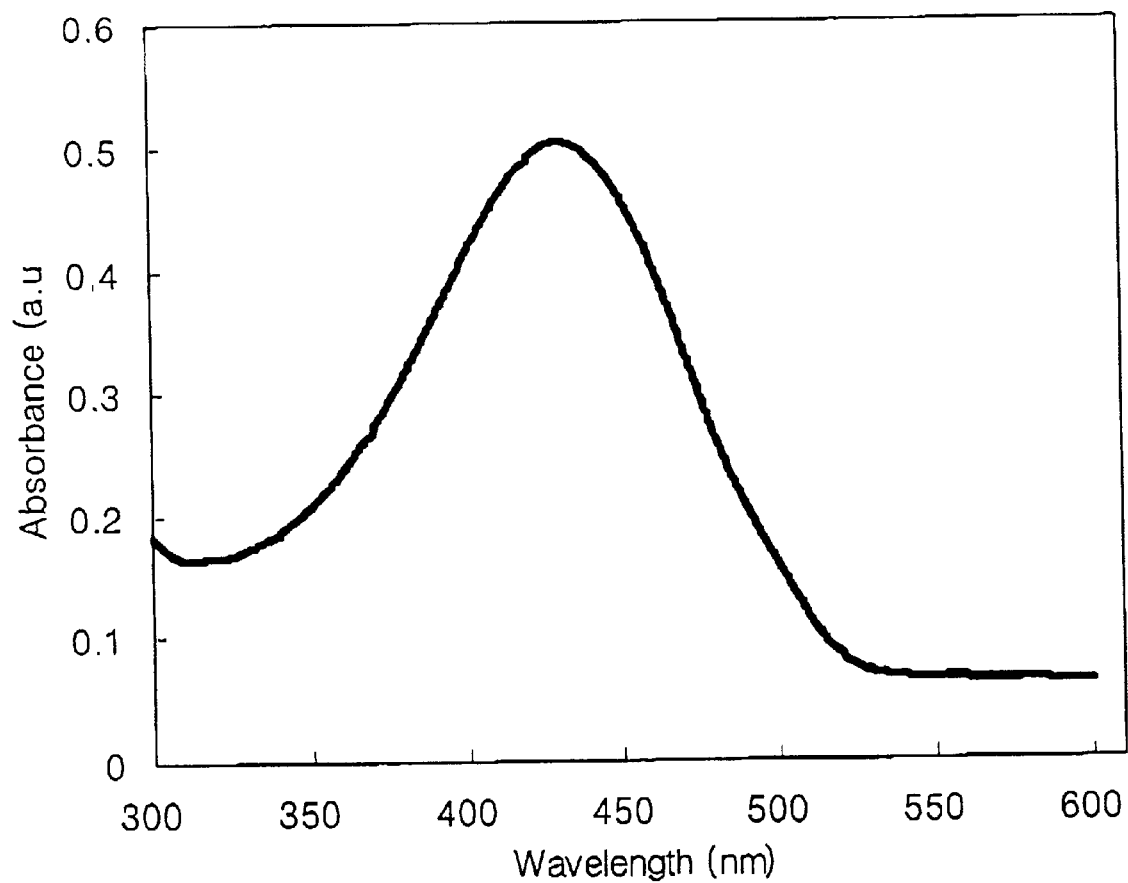
FIG. 7 is a UV-VIS spectrum of m-SiPhPPV as a light emitting polymer according to the present invention.
Figure 8:
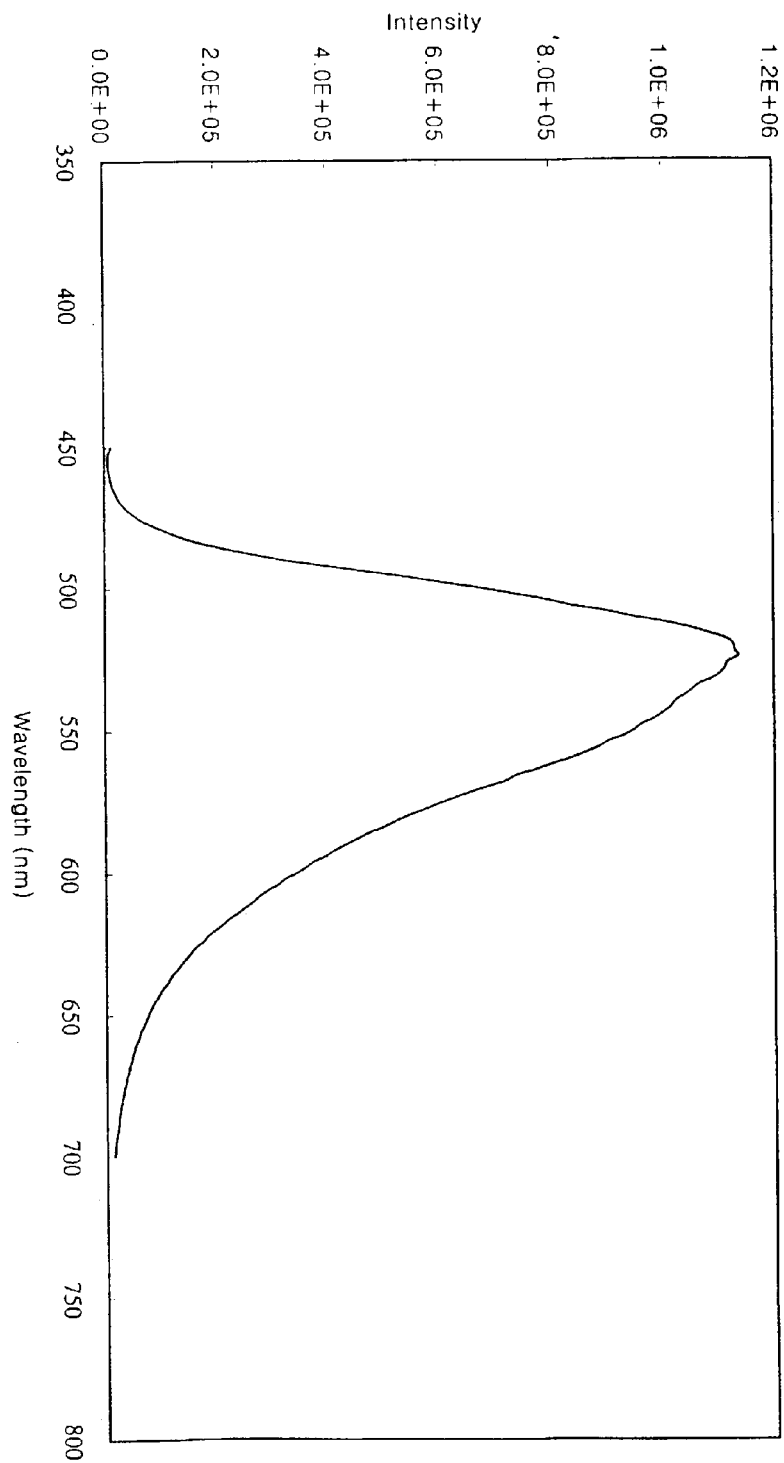
FIG. 8 is a PL spectrum of p-SiPhPPV as a light emitting polymer according to the present invention.
Figure 9:
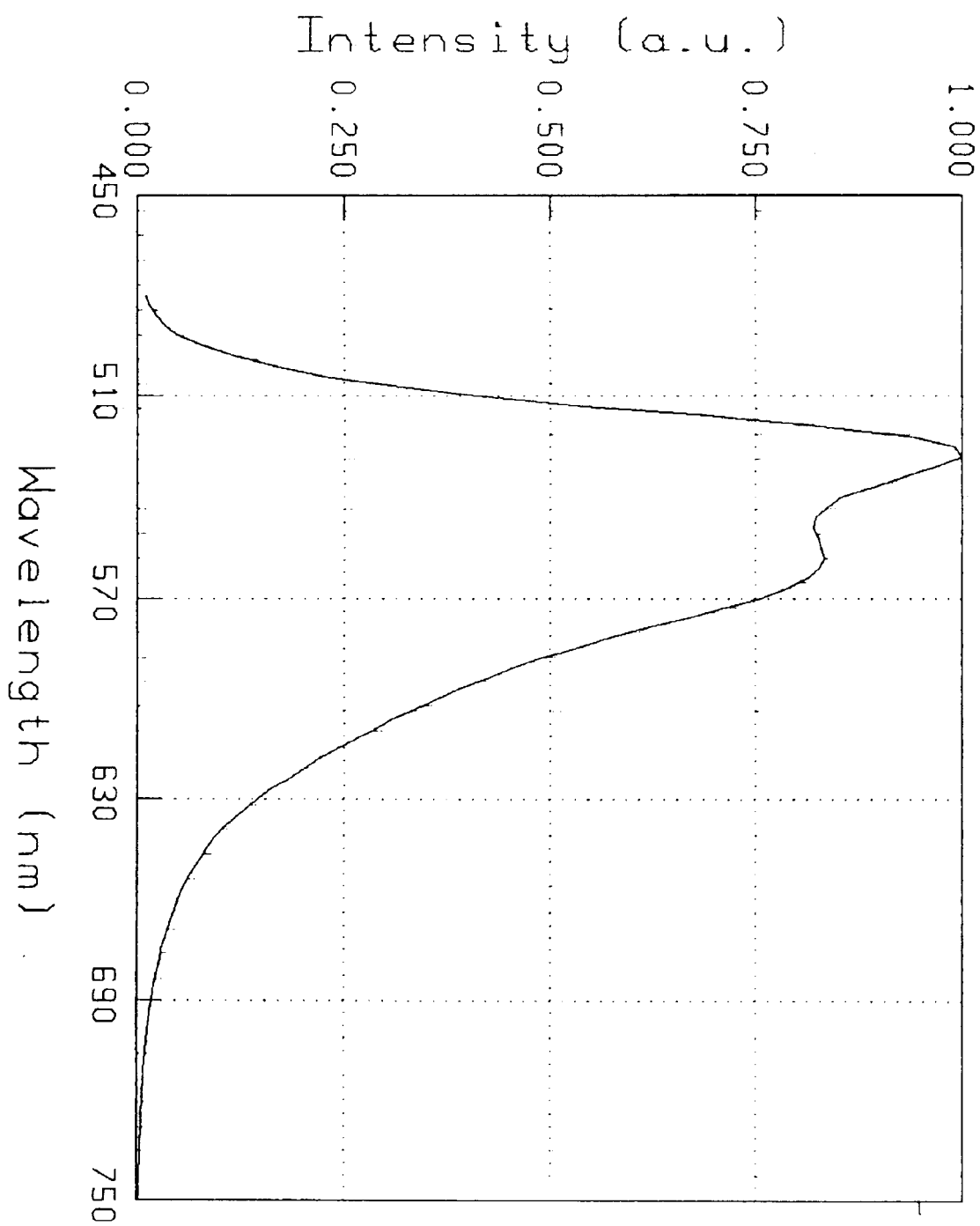
FIG. 9 is a PL spectrum of m-SiPhPPV as a light emitting polymer according to the present invention.
Figure 10:
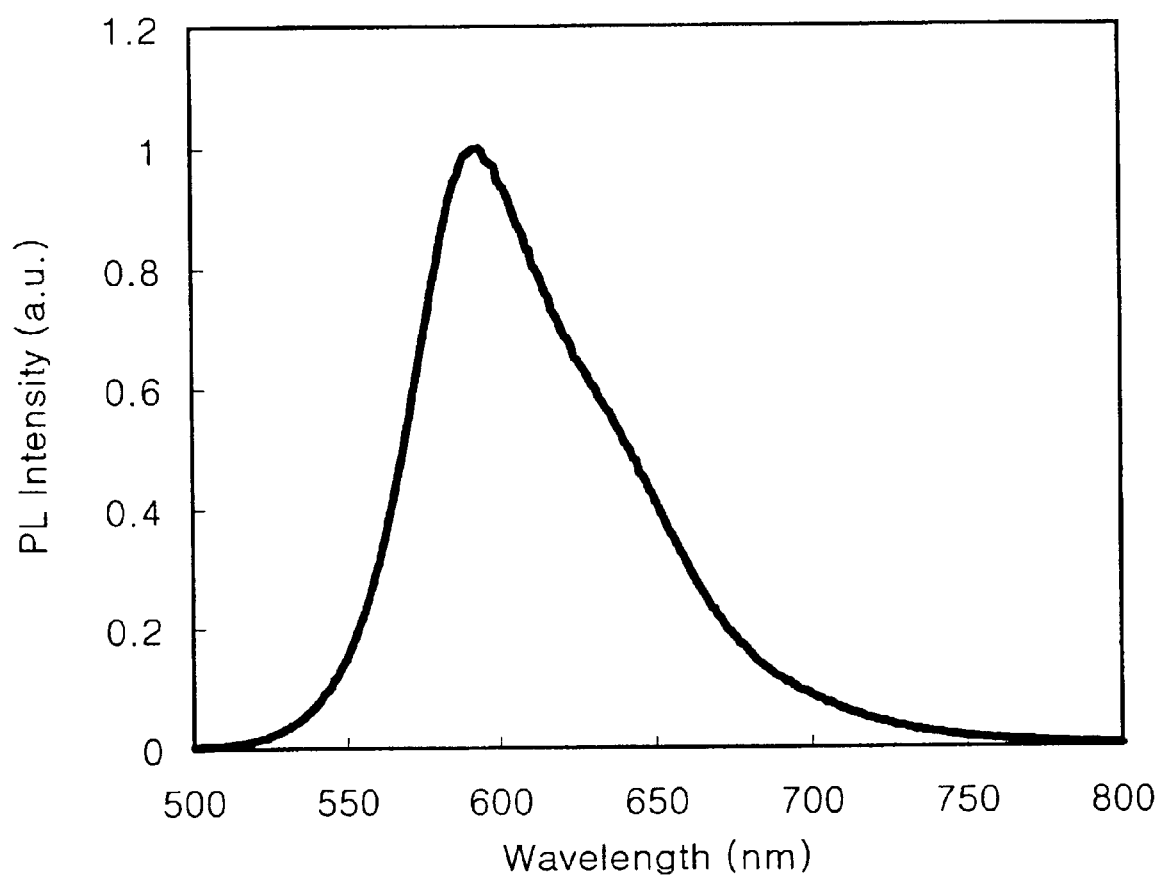
FIG. 10 is a PL spectrum of m-SiPhPPV-co-MEH-PPV as a light emitting copolymer according to the present invention.

The light emitting polymer solutions according to Examples 1, 2 and 4 were spin-coated on glass substrates to form polymer thin films. The UV absorption peak and the PL (photoluminescence) were measured. The thin films thus formed were uniform without pin holes, and the adhesion to the substrate was superior. FIG. 6 is a UV-VIS spectrum of p-SiPhPPV; FIG. 7 is a UV-VIS spectrum of m-SiPhPPV; FIG. 8 is a PL spectrum of p-SiPhPPV; FIG. 9 is a PL spectrum of m-SiPhPPV; and FIG. 10 is a PL spectrum of m-SiPhPPV-co-MEH-PPV.

In the m-SiPhPPV, the maximum UV absorption peak was 435 nm. With an excitation wavelength of 435 nm, the maximum peak of the PL spectrum was 527 nm, and a shoulder peak was seen at 558 nm. In the p-SiPhPPV, the maximum absorption peak was 427 nm, and the maximum PL peak was 524 nm. In the copolymer m-SiPhPPV-co-MEH-PPV of Example 4, the maximum UV absorption peak was 465 nm. With an excitation wavelength of 465 nm, the maximum peak of the PL spectrum was 592 nm. In the copolymer, since the MEH-PPV which was red so as to be superior in the electron donation was introduced, much red-shifted spectra could be observed in the copolymer compared with the m-SiPhPPV and p-SiPhPPV.

Measurement of Electric Properties

Figure 11:
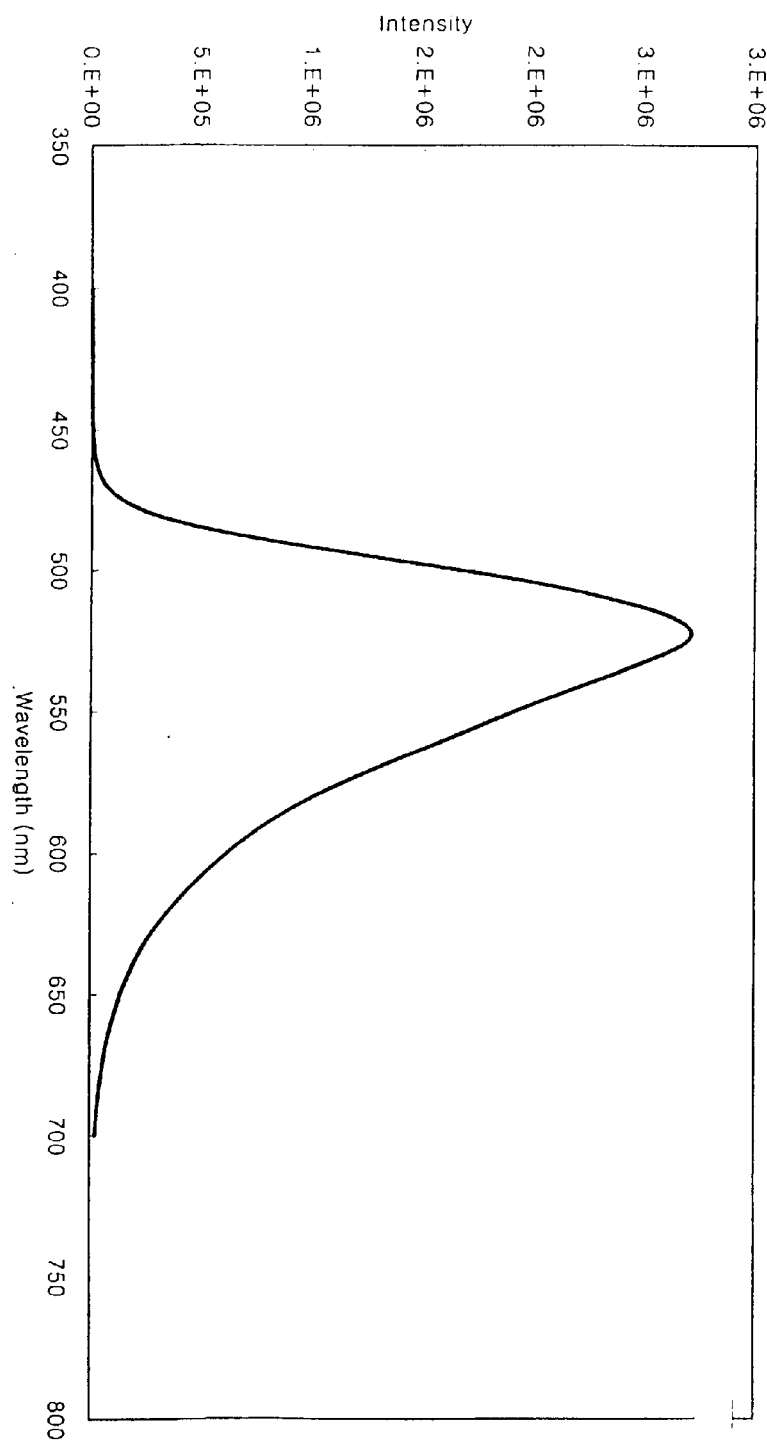
FIG. 11 is an EL spectrum measured for an EL device, the EL device being manufactured with p-SiPhPPV as a light emitting polymer according to the present invention.
Figure 12:
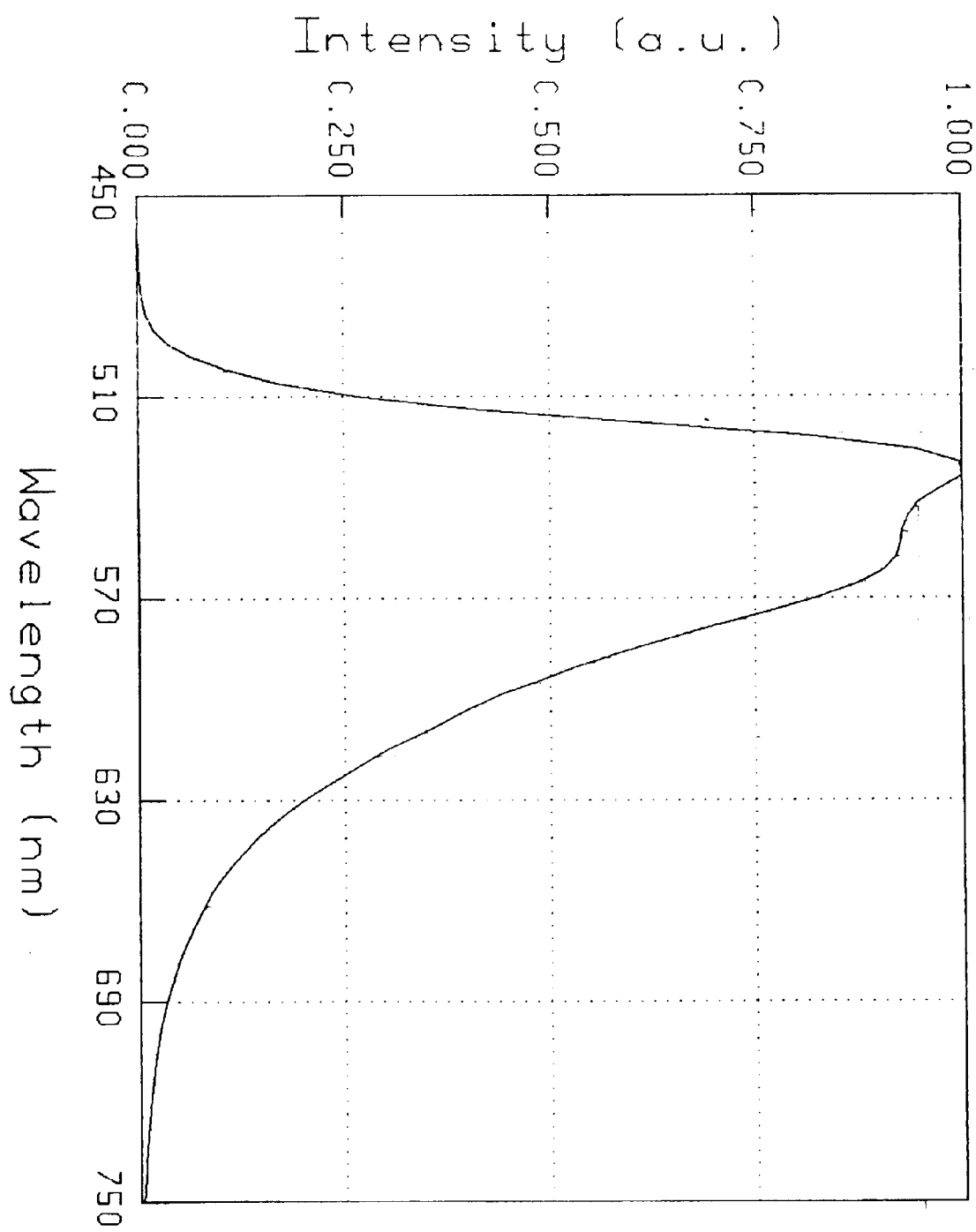
FIG. 12 is an EL spectrum measured for an EL device, the EL device being manufactured with m-SiPhPPV as a light emitting polymer according to the present invention.
Figure 13:
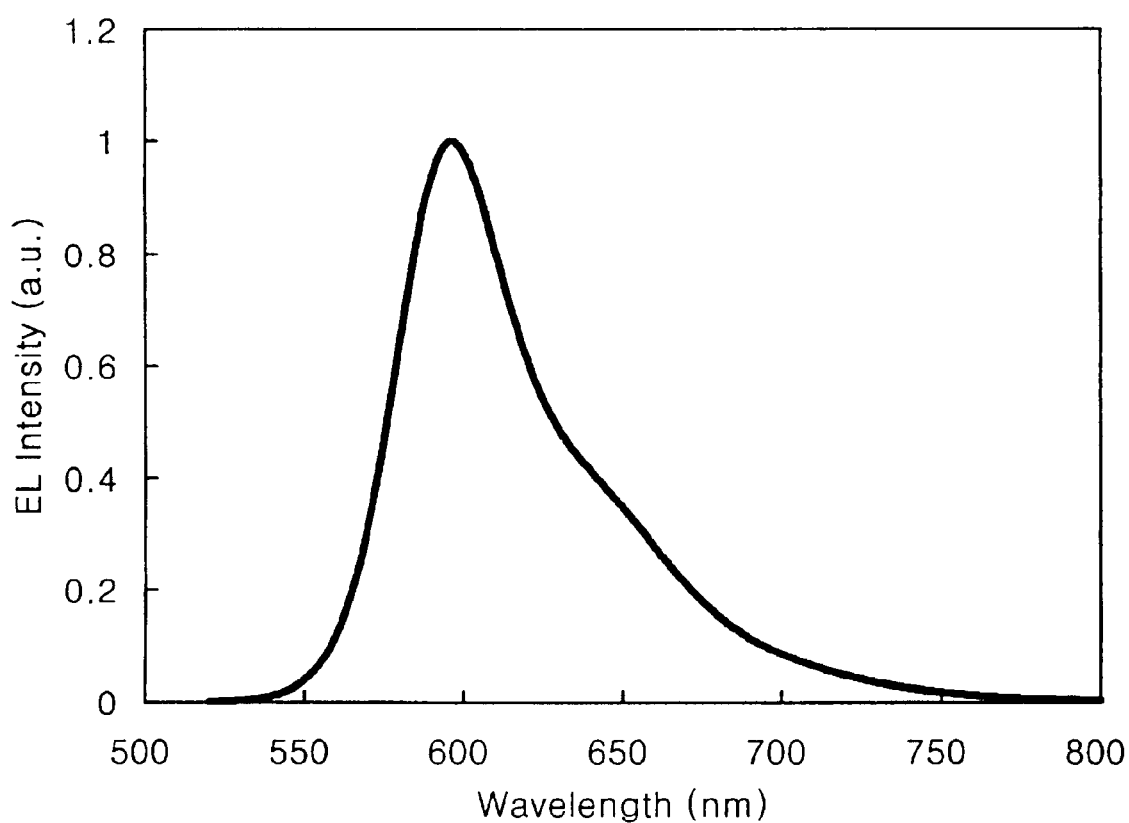
FIG. 13 is an EL spectrum of an [ITO/PEDOT/light emitting polymer/Al:Li] diode manufactured with m-SiPhPPV-co-MEH-PPV as a light emitting copolymer according to the present invention.

The EL devices which had been manufactured by using the light emitting polymers of Examples 1, 2 and 4 were measured for electroluminescence properties, and the results are illustrated in FIGS. 11, 12 and 13. FIG. 11 is an EL spectrum measured for an EL device manufactured with p-SiPhPPV; FIG. 12 is an EL spectrum measured for an EL device manufactured with m-SiPhPPV; and FIG. 13 is an EL spectrum of an [ITO/PEDOT/light emitting polymer /Al:Li] diode manufactured with m-SiPhPPV-co-MEH-PPV.

Figure 15:
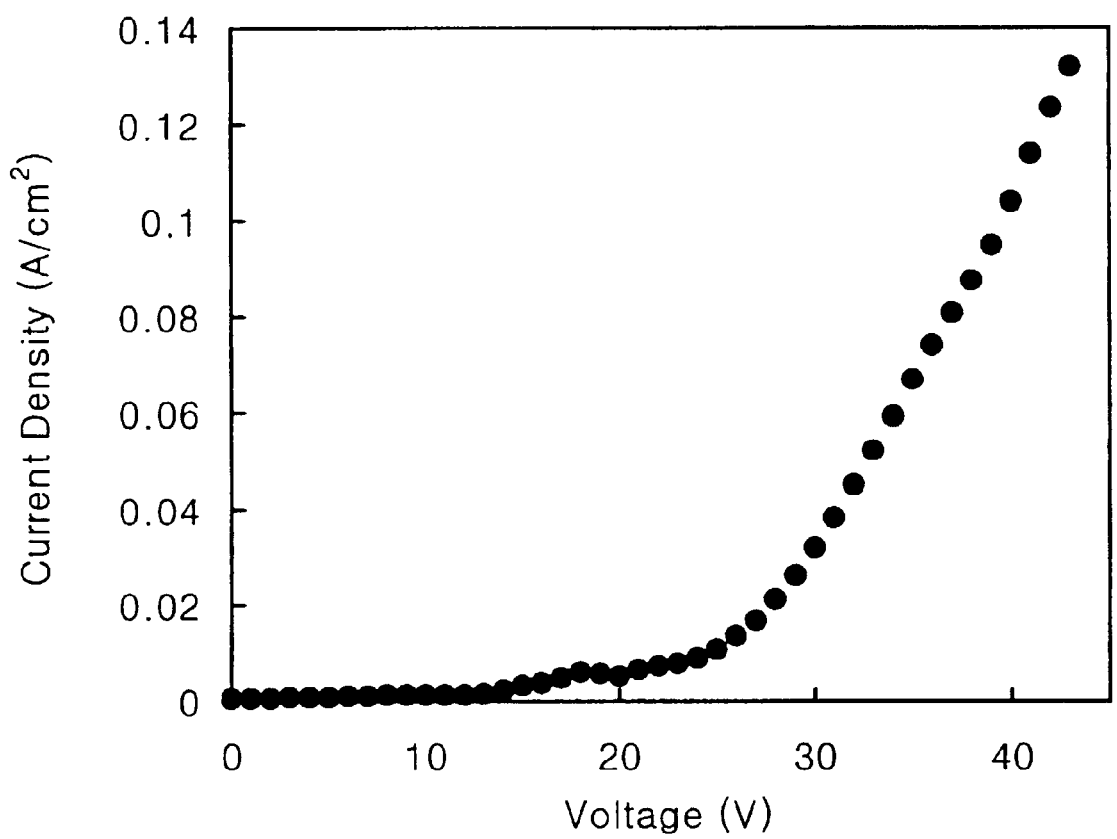
FIG. 15 is an I-V characteristic of an [ITO/PEDOT/light emitting polymer/LiF/Al] diode manufactured with m-SiPhPPV according to the present invention.
Figure 18:
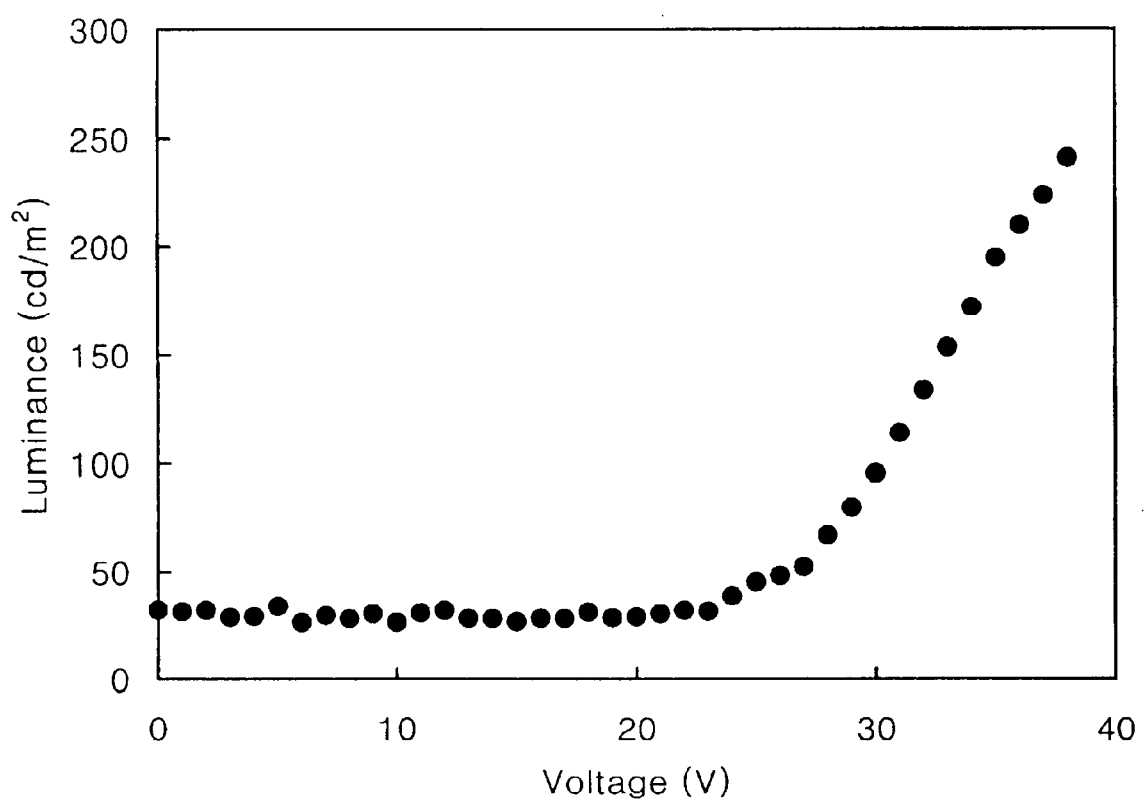
FIG. 18 is an L-V characteristic of an [ITO/PEDOT/light emitting polymer/LiF/Al] diode manufactured with m-SiPhPPV according to the present invention.

The single layer type EL devices which had the ITO/PEDOT/ light emitting polymer/(LiF)/Al structure all showed the typical characteristics of the rectifying diode. In the m-SiPhPPV, the driving voltage was about 11V as shown in FIG. 15, and the maximum brightness was 250 cd/$m^2$ as shown in FIG. 18, while the maximum efficiency of the device was 0.0490 lm/W. In the device configuration of ITO/PEDO/light emitting polymer/Ca/Al, the driving voltage and the maximum brightness were about 6.6V and 2153 cd/$m^2$, respectively. And the maximum efficiency of the device was 0.0490 lm/W.

FIG. 15 is an I-V characteristic of an [ITO/PEDOT/light emitting polymer/LiF/Al] diode manufactured with m-SiPhPPV according to the present invention; and FIG. 18 is an L-V characteristic of an [ITO/PEDOT/light emitting polymer/LiF/Al] diode manufactured with m-SiPhPPV according to the present invention.

Figure 14:
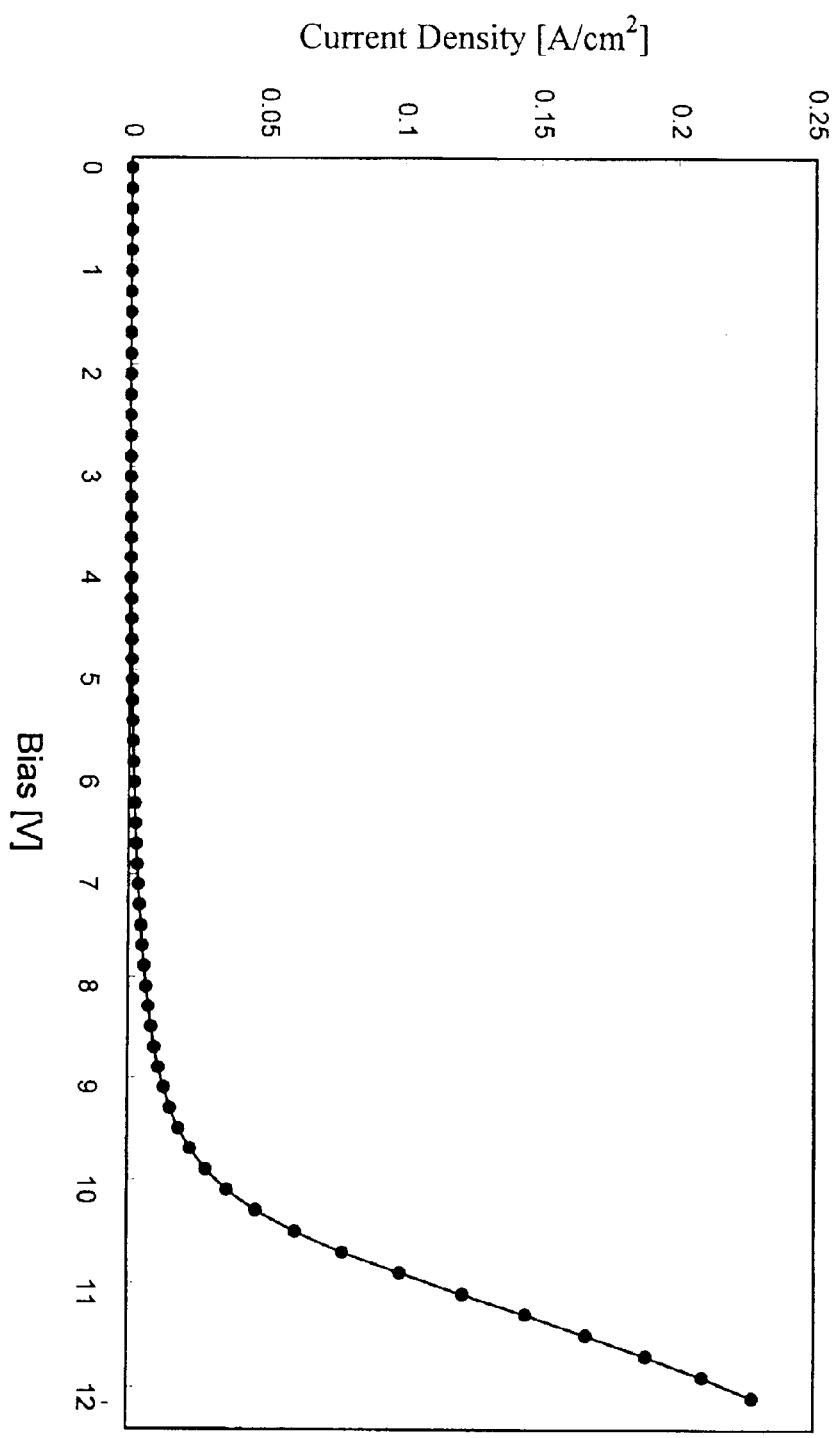
FIG. 14 is an I-V characteristic of an [ITO/PEDOT/light emitting polymer/LiF/Al] diode manufactured with p-SiPhPPV according to the present invention.
Figure 17:
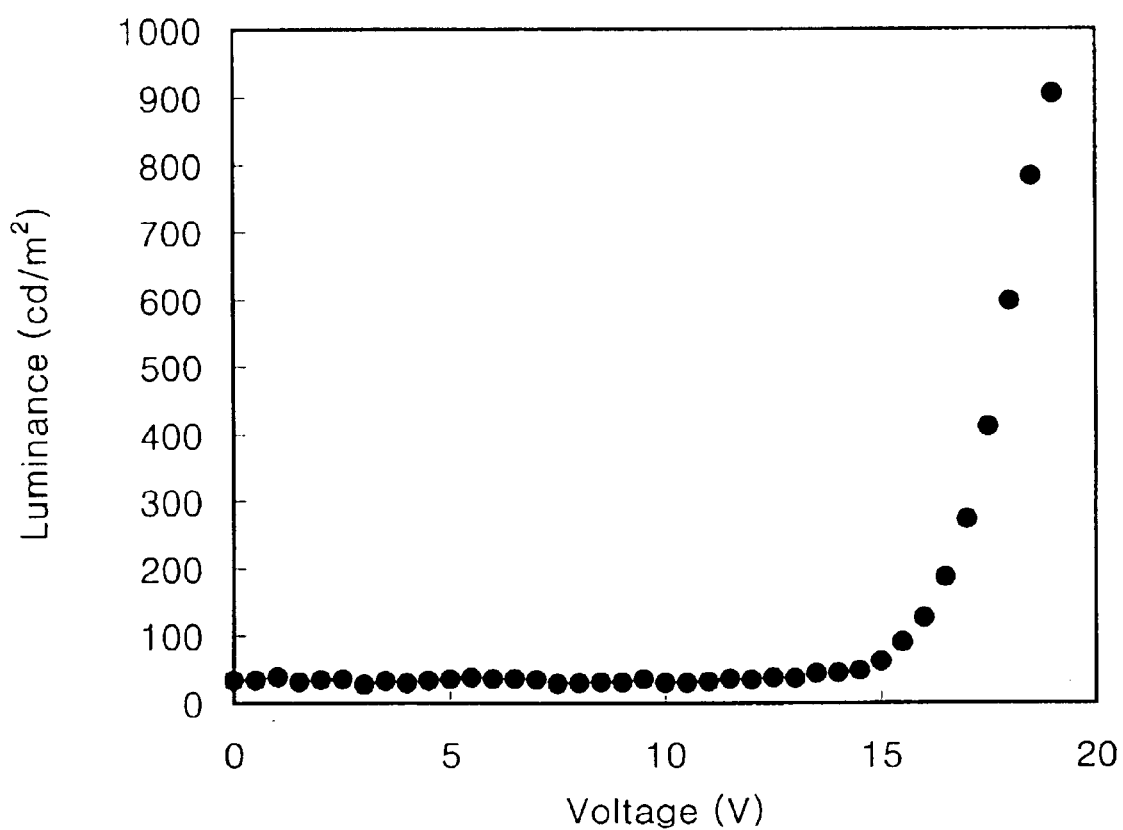
FIG. 17 is an L-V characteristic of an [ITO/PEDOT/light emitting polymer/LiF/Al] diode manufactured with p-SiPhPPV according to the present invention.

In case of the p-SiPhPPV, in the ITO/PEDOT/light emitting polymer/(LiF)/Al structure, the driving voltage was 7.2 V (FIG. 14), and the maximum brightness was 910 cd/m$^2$ (FIG. 17), while the maximum light emitting efficiency was 0.1718 lm/W. In the device configuration of ITO/PEDOT/Polymer/Ca/Al, the driving voltage and the maximum brightness were about 6.7 V and 5890 cd/M$^2$, respectively. And the maximum efficiency of the device was 0.251 lm/W. FIG. 14 is an I-V characteristic of an [ITO/PEDOT/light emitting polymer/LiF/Al] diode manufactured with p-SiPhPPV and FIG. 17 is an L-V characteristic of an [ITO/PEDOT/light emitting polymer/LiF/Al] diode manufactured with p-SiPhPPV.

In the m-SiPhPPV-co-MEH-PPV, the driving voltage was about 3.9 V, and the maximum brightness was about 11000 cd/m$^2$, while the maximum light emitting efficiency was 2.1983 m/W. In the copolymer according to the present invention, owing to the introduction of MEH-PPV, the HOMO level was raised and the LUMO level was lowered compared with the m-SiPhPPV and p-SiPhPPV, and therefore, the driving voltage was low in relative terms, while the maximum brightness and light emitting efficiency were steeply increased. As a result, the stability of the device was very good.

Figure 16:
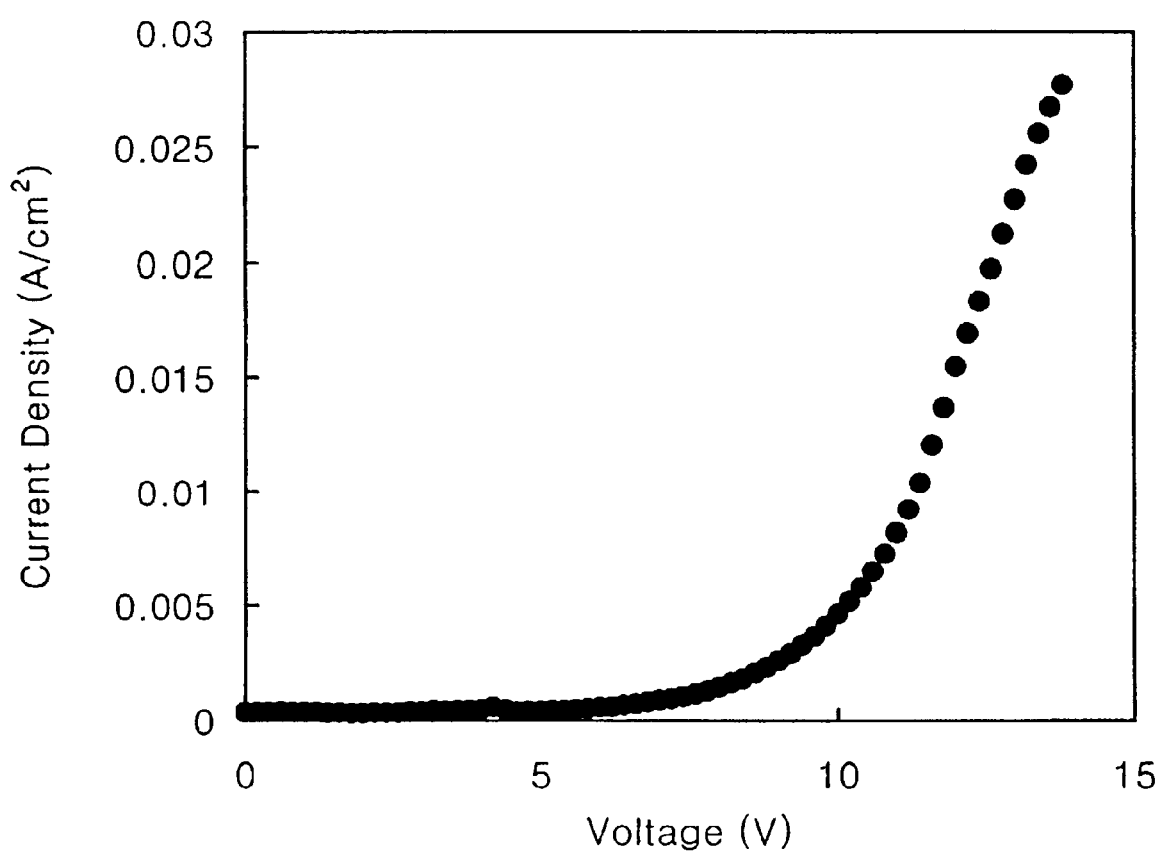
FIG. 16 is an I-V characteristic of an [ITO/PEDOT/light emitting polymer/Al:Li] diode manufactured with m-SiPhPPV-co-MEH-PPV according to the present invention.
Figure 19:
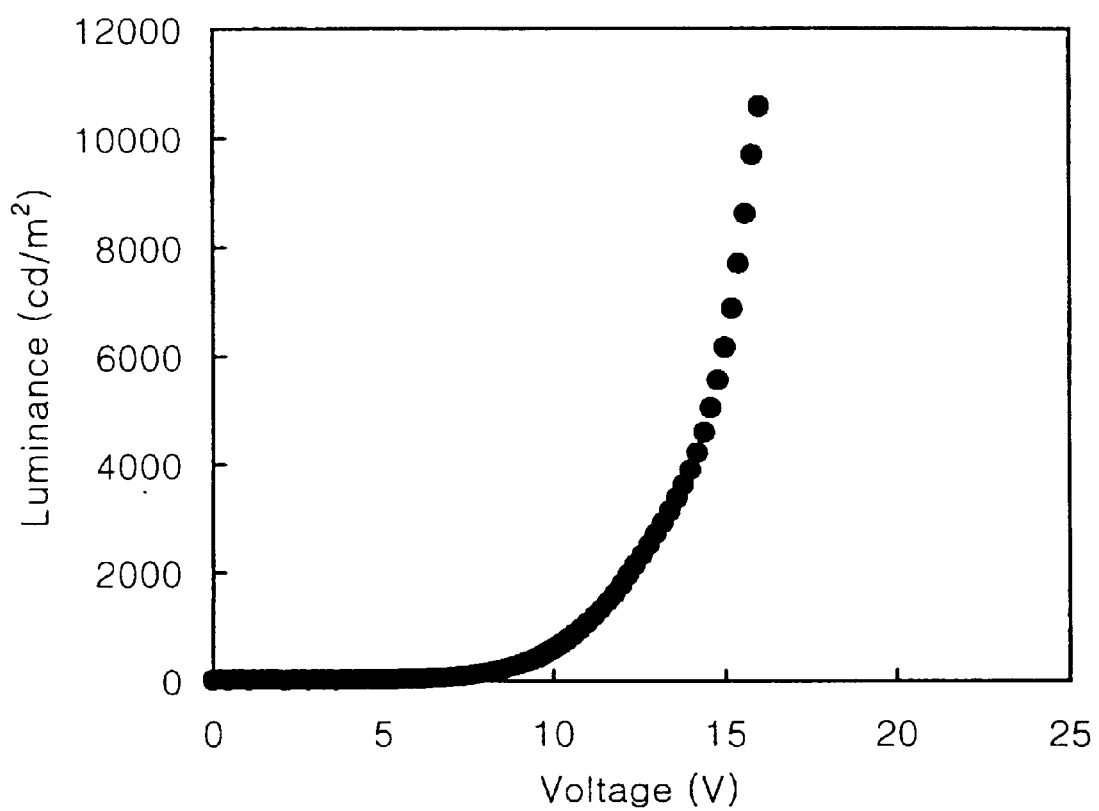
FIG. 19 is an L-V characteristic of an [ITO/PEDOT/light emitting polymer/Al:Li] diode manufactured with m-SiPhPPV-co-MEH-PPV according to the present invention.
Figure 20:
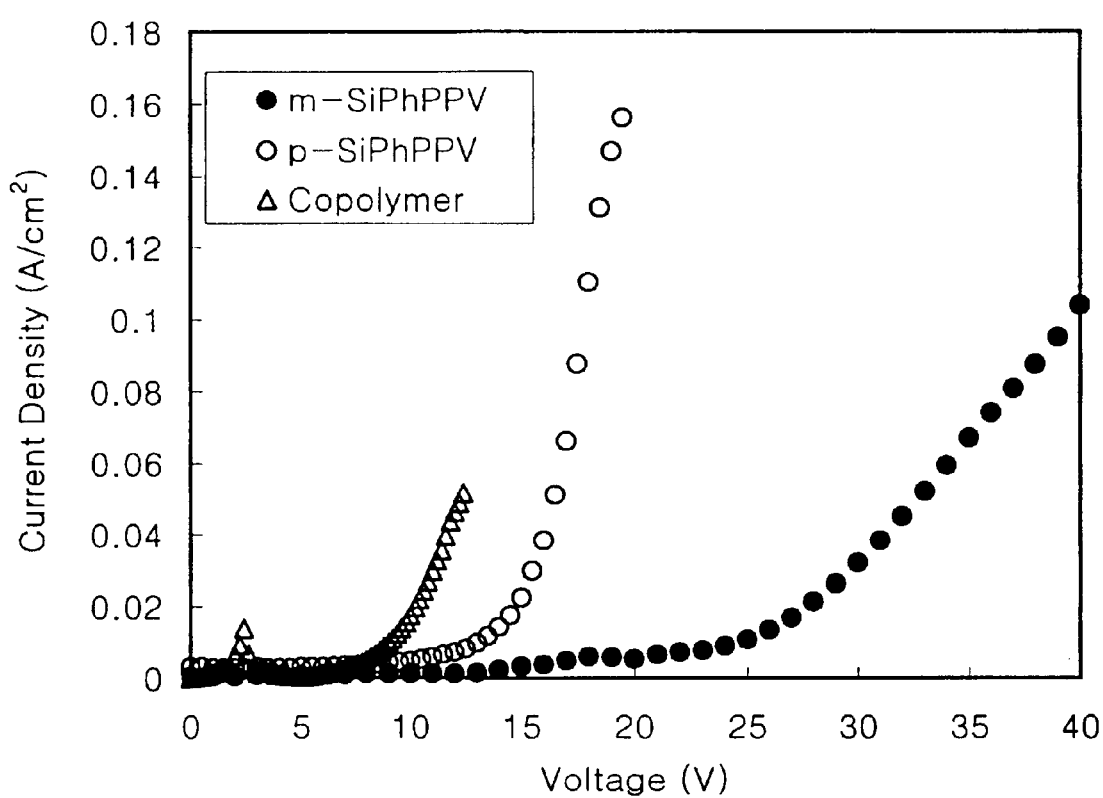
FIG. 20 is I-V characteristics of the [ITO/PEDOT/light emitting polymer/LiF/Al] diodes manufactured with the light emitting polymers of Examples 1, 2 and 4 of the present invention.
Figure 21:
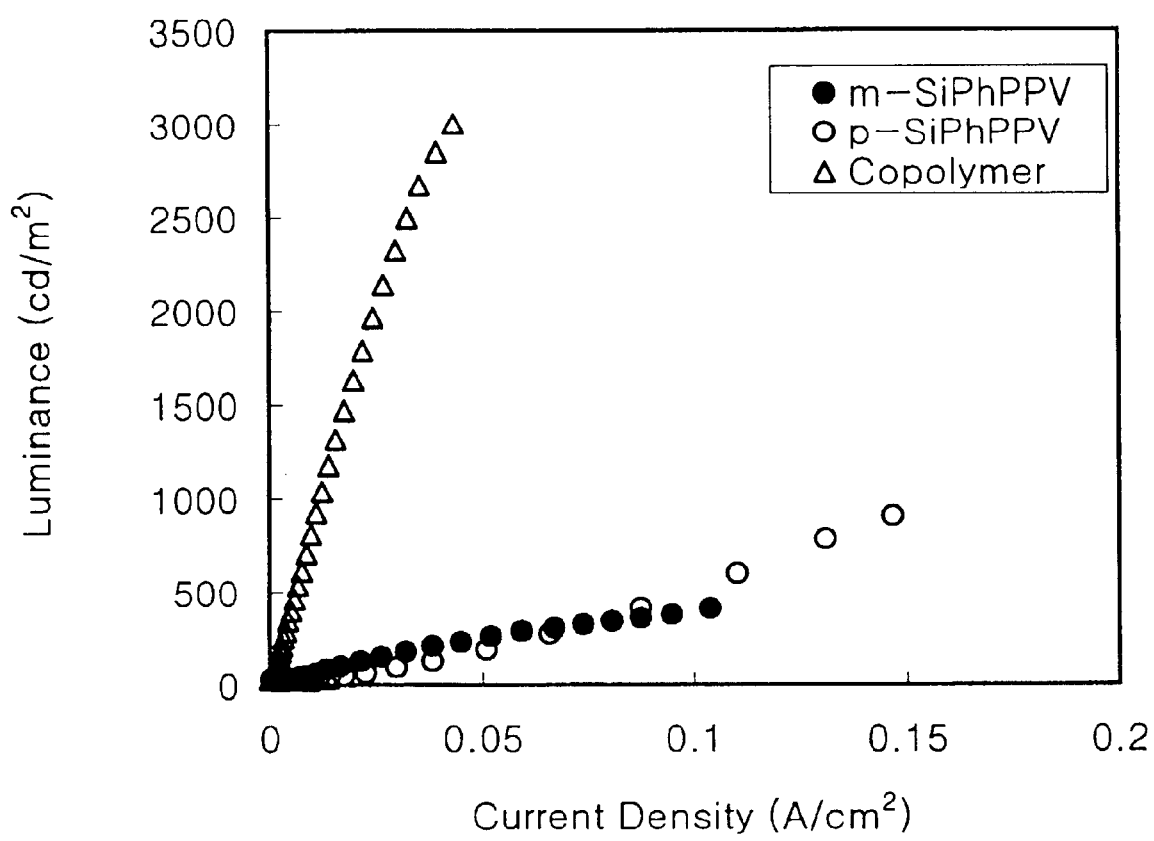
FIG. 21 is L-I characteristics of the [ITO/PEDOT/light emitting polymer/LiF/Al] diodes manufactured with the light emitting polymers of Examples 1, 2 and 4 of the present invention.

In the copolymer m-SiPhPPV-co-MEH-PPV, superior current-voltage (FIG. 16) and superior luminance-voltage (FIG. 19) characteristics were seen compared with the case of m-SiPhPPV or p-SiPhPPV. Even after many rounds of repeated drives, the manufactured EL devices showed stable voltage-current density characteristics. FIG. 16 is an I-V characteristic of an [ITO/PEDOT/light emitting polymer/Al:Li] diode manufactured with m-SiPhPPV-co-MEH-PPV according to the present invention; and FIG. 19 is an L-V characteristics of an [ITO/PEDOT/light emitting polymer/Al:Li] diode manufactured with m-SiPhPPV-co-MEH-PPV. FIG. 20 is I-V characteristics of the [ITO/PEDOT/light emitting polymer/LiF/Al] diodes manufactured with the light emitting polymers of Examples 1, 2 and 4 of the present invention; and FIG. 21 is L-I characteristics of the [ITO/PEDOT/light emitting polymer/LiF/Al] diodes manufactured with the light emitting polymers of Examples 1, 2 and 4 of the present invention.

Comparative Example

Figure 22:
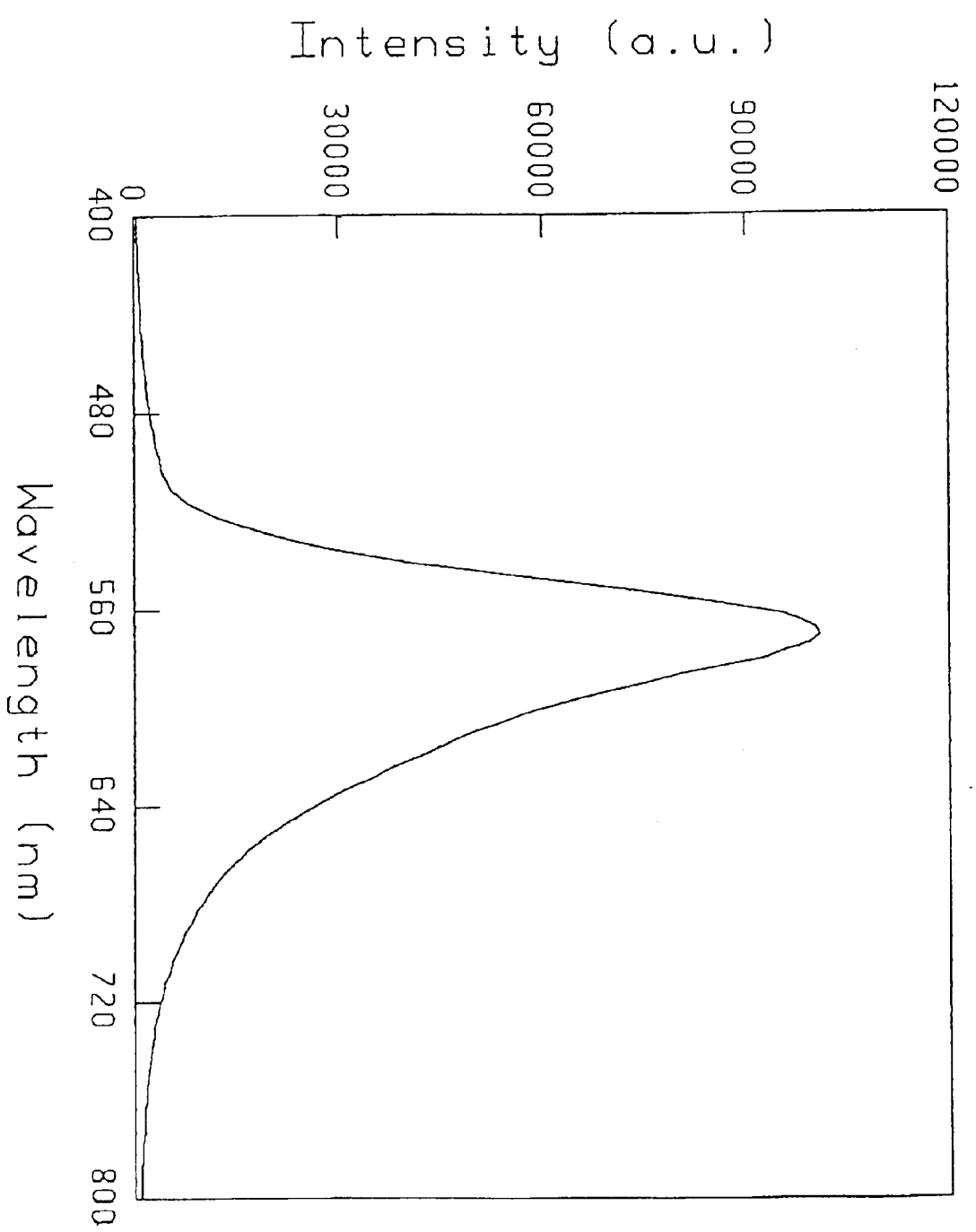
FIG. 22 is an EL spectrum of the diode manufactured with the MEH-PPV of Comparative Example of the invention.
Figure 23:
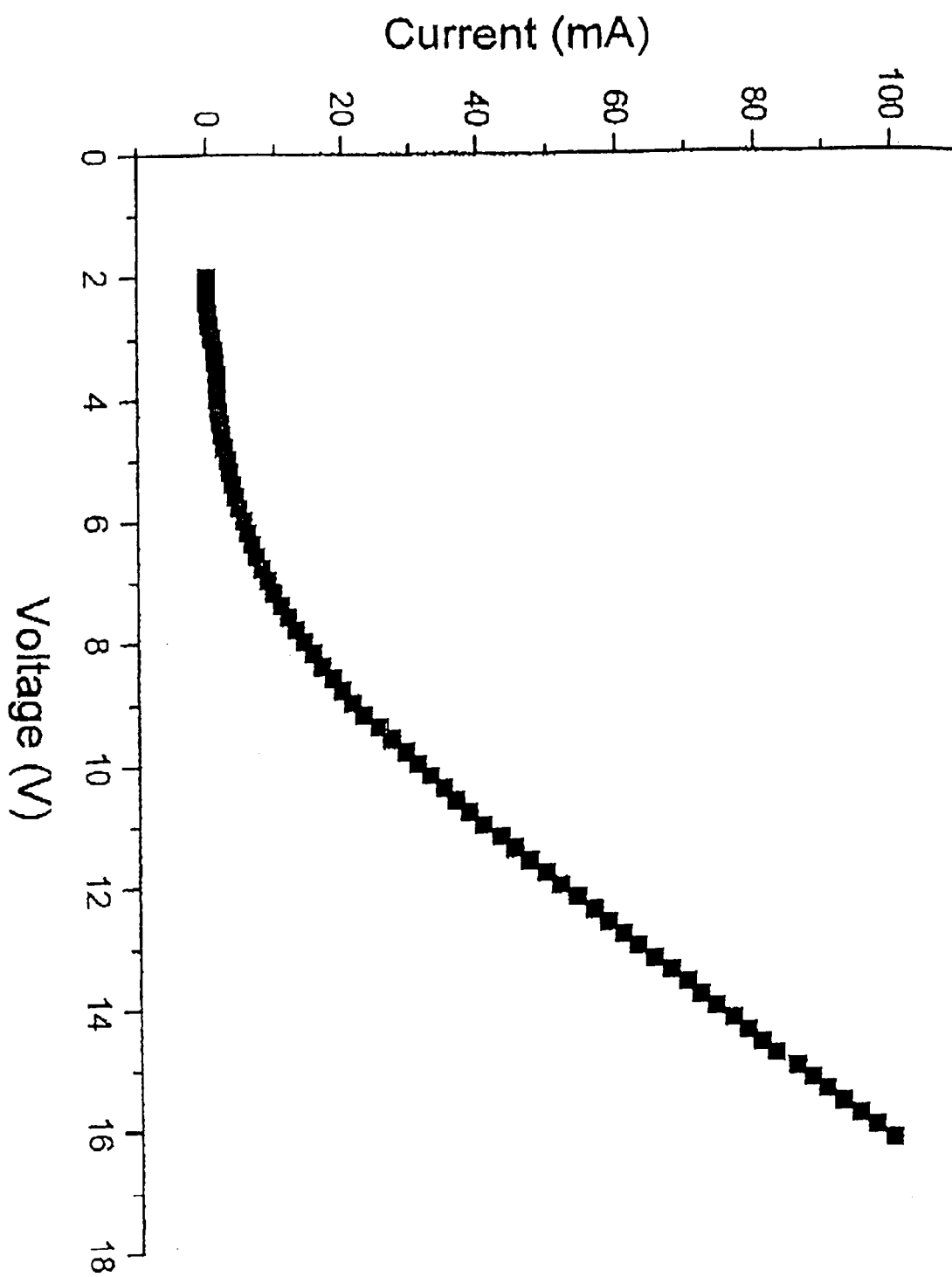
FIG. 23 is an I-V characteristic of the diode manufactured with the MEH-PPV of Comparative Example of the invention.

In this comparative example, the MEH-PPV was used as the light emitting layer, and the electro-optical characteristics were compared with those of the Examples of the present invention. The voltage was fixed to 10 V, and then the EL spectrum was measured, and was shown in FIG. 22. The device showed an emission in the reddish orange region. The I-V characteristic is shown in FIG. 23, and the driving voltage was about 7 V. That is, at 7 V, the current began to slowly flow.

According to the present invention as described above, the main chain is a poly(p-phenylenevinylene) group, and phenyl silicon with an aliphatic alkyl group introduced therein is contained in the side chain. Therefore, the polymer is superior in solubility in organic solvents, and is also superior in light emitting efficiency, in surface characteristics (with electrodes), and in thin film formation. Further, the EL polymers are copolymerized with MEH-PPV, and thus, the color tuning is superior, and the display characteristic is also superior.

In the above, the present invention was described based on the specific preferred embodiments and the attached drawings, but it should be apparent to those ordinarily skilled in the art that various changes and modifications can be added without departing from the spirit and scope of the present invention which will be defined in the appended claims.

What is claimed is:

1. A light-emitting polymer comprising a main chain comprised of poly(p-phenylenevinylene) (PPV) units and side chains comprising phenyl silicon groups having aliphatic alkyl groups, said polymer being represented by the following formula (I):

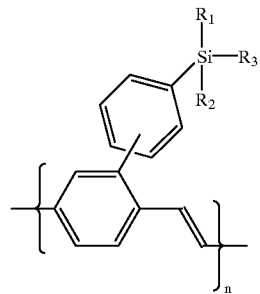

wherein $R_1$, $R_2$ and $R_3$ are selected from the group consisting of linear aliphatic alkyl groups, branched alkyl groups and fluorinated alkyl groups.

2. The light-emitting polymer as claimed in claim 1, wherein said linear aliphatic alkyl group is represented by $(CH_2)_nCH_3$, where n is an integer from 0 to 12, said branched alkyl group is represented by $CH_2(CH_2)_aCH(CH_2)_bCH_3CH(CH3)2$ where a is an integer from 0 to 5 and b is an integer from 0 to 10, and said fluorinated alkyl group is represented by $CH_2(CF_2)_nCF_3$ where n is an integer from 0 to 12.

3. The light-emitting polymer as claimed in claim 1, wherein said silicon group having aliphatic alkyl groups is bonded to a meta- or a para-position of the phenyl group.

4. The light-emitting polymer as claimed in claim 3, wherein the light emitting polymer has a weight average molecular weight (Mw) of from about 10,000 to about 1,000,000, and a molecular weight distribution of from about 1.5 to about 5.

5. An electroluminescent device having a structure selected from the group consisting of anode/light emitting layer/cathode, anode/buffer layer/light emitting layer/cathode, anode/buffer layer/hole transporting layer/light emitting layer/cathode, anode/buffer layer/hole transporting layer/light emitting layer/electron transporting layer/cathode, and anode/buffer layer/hole transporting layer/light emitting layer/hole blocking layer/cathode, wherein the light emitting layer comprises a light-emitting polymer comprising a main chain comprised of poly(p-phenylenevinylene) (PPV) units and side chains comprising phenyl silicon groups having aliphatic alkyl groups, said polymer being represented by the following formula (I):

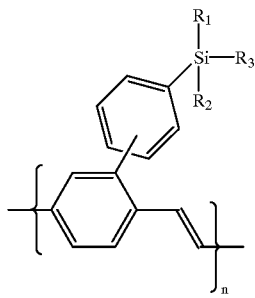

wherein $R_1$, $R_2$ and $R_3$ are selected from the group consisting of linear aliphatic alkyl groups, branched alkyl groups and fluorinated allyl groups.

6. The electroluminescent device as claimed in claim 5, wherein the buffer layer is selected from the group consisting of a polythiophene, a polyaniline, a polyacetylene, a polypyrrole, and a poly(p-phenylenevinylene) derivative.

7. The electroluminescent device as claimed in claim 5, wherein the hole blocking layer comprises LiF or $MgF_2$.

8. A light-emitting copolymer including (a) units composed of poly(p-phenylenevinylene) as the main chain and phenyl silicon groups with aliphatic alkyl groups as the side chains and (b) units of MEH-PPV (methoxyethylhexyloxy-PPV), the copolymer being represented by the following formula (II):

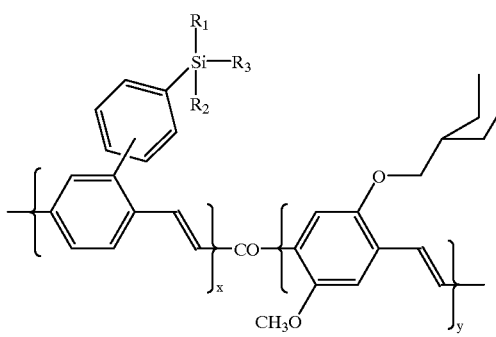

II wherein $R_1$, $R_2$ and $R_3$ are selected from the group consisting of a linear aliphatic alkyl group, a branched alkyl group and a fluorinated alkyl group, x is about 0.1–0.9 and y is about 0.9–0.1.

9. The light-emitting copolymer as claimed in claim 8, wherein said linear aliphatic alkyl is represented by $(CH_2)_n CH_3$ where n is an integer from 0 to 12, said branched alkyl is represented by $CH_2(CH_2)_a CH(CH_2)_b CH_3 CH(CH_3)_2$ where a is an integer from 0 to 5 and b is an integer from 0 to 10, and said fluorinated alkyl is represented by $CH_2(CF_2)_n CF_3$ where n is an integer from 0 to 12.

10. The light-emitting copolymer as claimed in claim 8, wherein said silicon group having aliphatic alkyl groups is bonded to a meta- or a para- position of the phenyl group.

11. The light-emitting copolymer as claimed in claim 10, wherein the light emitting polymer has a weight average molecular weight (Mw) of from about 10,000 to about 1,000,000, and a molecular weight distribution of from about 1.5 to about 5.

12. An electroluminescent device having a structure selected from the group consisting of anode/light emitting layer/cathode, anode/buffer layer/light emitting layer/cathode, anode/buffer layer/hole transporting layer/light emitting layer/cathode, anode/buffer layer/hole transporting layer/light emitting layer/electron transporting layer/cathode, and anode/buffer layer/hole transporting layer/light emitting layer/hole blocking layer/cathode, wherein the light emitting layer comprises a light-emitting copolymer including (a) units composed of poly(p-phenylenevinylene) as the main chain and phenyl silicon groups with aliphatic alkyl groups as the side chains and (b) units of MEH-PPV (methoxyethylhexyloxy-PPV), the copolymer being represented by the following formula (II):

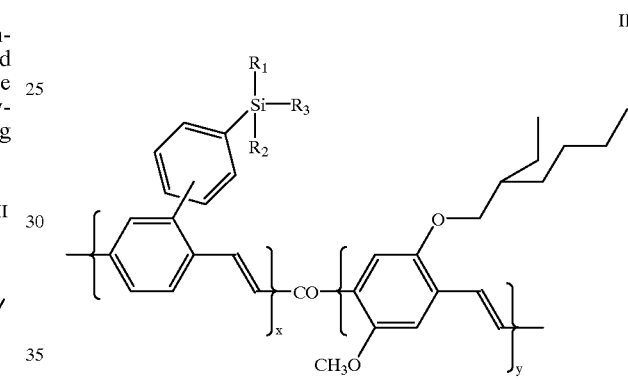

II wherein $R_1$, $R_2$ and $R_3$ are selected from the group consisting of a linear aliphatic alkyl group, a branched alkyl group and a fluorinated alkyl group, x is about 0.1–0.9 and y is about 0.9–0.1.

13. The electroluminescent device as claimed in claim 12, wherein the buffer layer is selected from the group consisting of a polythiophene, a polyaniline, a polyacetylene, a polypyrrole, and a poly(p-phenylenevinylene) derivative.

14. The electroluminescent device as claimed in claim 12, wherein the hole blocking layer comprises LiF or $MgF_2$.

15. The electroluminescent device as claimed in claim 5, wherein the cathode comprises aluminum, calcium or an alloy or aluminum and lithium.

16. The electroluminescent device as claimed in claim 12, wherein the cathode comprises aluminum, calcium or an alloy or aluminum and lithium.

* * * * *